(12) United States Patent
Buchwald et al.

(10) Patent No.: US 7,286,597 B2
(45) Date of Patent: Oct. 23, 2007

(54) METHODS AND SYSTEMS FOR ADAPTIVE RECEIVER EQUALIZATION

(75) Inventors: Aaron Buchwald, Newport Coast, CA (US); Xicheng Jiang, Irvine, CA (US); Hui Wang, Irvine, CA (US); Howard A. Baumer, Laguna Hills, CA (US); Avanindra Madisetti, Coto De Caza, CA (US)

(73) Assignee: Broadcom Corporation, Irvine, CA (US)

( * ) Notice: Subject to any disclaimer, the term of this patent is extended or adjusted under 35 U.S.C. 154(b) by 596 days.

(21) Appl. No.: 09/844,283

(22) Filed: Apr. 30, 2001

(65) Prior Publication Data

US 2002/0034222 A1 Mar. 21, 2002

Related U.S. Application Data

(60) Provisional application No. 60/200,813, filed on Apr. 28, 2000.

(51) Int. Cl.
*H03H 7/30* (2006.01)
(52) U.S. Cl. ............... 375/232; 375/229; 375/346; 360/51; 704/200
(58) Field of Classification Search ........ 375/232, 375/229, 222, 346; 398/82; 704/200; 360/51
See application file for complete search history.

(56) References Cited

U.S. PATENT DOCUMENTS

| | | | |
|---|---|---|---|
| 5,235,671 A * | 8/1993 | Mazor | 704/200 |
| 5,396,224 A | 3/1995 | Dukes et al. | |
| 5,485,490 A | 1/1996 | Leung et al. | 375/371 |
| 5,550,546 A | 8/1996 | Noneman et al. | |
| 5,554,945 A | 9/1996 | Lee et al. | |

(Continued)

FOREIGN PATENT DOCUMENTS

EP 0 483 439 5/1992

(Continued)

OTHER PUBLICATIONS

Buchwald, A. and Martin, K., "Integrated Fiber-Optic Receivers," Kluwer Academic Publishers, 1994 (entire book submitted).

(Continued)

*Primary Examiner*—Chieh M. Fan
*Assistant Examiner*—Eva Zheng
(74) *Attorney, Agent, or Firm*—Sterne, Kessler, Goldstein & Fox P.L.L.C.

(57) ABSTRACT

Methods and systems for minimizing distortions in an analog data signal include equalizing the analog data signal at a receive end. In an embodiment, the invention adapts equalization parameters to a signal path associated with the analog data signal. Adaptive control logic is implemented with analog and/or digital components. In an embodiment, the invention equalizes a discreet-time analog representation of an analog data signal. In an embodiment, the invention digitally controls equalization parameters. In an embodiment, a resultant equalized analog data signal is digitized. In an example implementation, an analog data signal is sampled, a quality of the samples is measured, and one or more equalization parameters are adjusted with digital controls as needed to minimize distortion of the samples. The equalized samples are then digitized. The present invention is suitable for lower rate analog data signals and multi-gigabit data rate analog signals.

17 Claims, 39 Drawing Sheets

U.S. PATENT DOCUMENTS

| | | | |
|---|---|---|---|
| 5,614,855 A | 3/1997 | Lee et al. | |
| 5,650,954 A | 7/1997 | Minuhin | 364/825 |
| 5,703,905 A | 12/1997 | Langberg | |
| 5,757,857 A | 5/1998 | Buchwald | 375/271 |
| 5,768,268 A | 6/1998 | Kline et al. | |
| 5,822,143 A | 10/1998 | Cloke et al. | |
| 5,881,107 A | 3/1999 | Termerinac et al. | |
| 5,881,108 A | 3/1999 | Herzberg et al. | 375/296 |
| 5,945,862 A | 8/1999 | Donnelly et al. | |
| 5,949,820 A * | 9/1999 | Shih et al. | 375/229 |
| 5,966,415 A | 10/1999 | Bliss et al. | 375/350 |
| 6,002,279 A | 12/1999 | Evans et al. | 327/144 |
| 6,005,445 A | 12/1999 | Katakura | |
| 6,009,534 A | 12/1999 | Chiu et al. | |
| 6,038,269 A | 3/2000 | Raghavan | |
| 6,122,336 A | 9/2000 | Anderson | 375/371 |
| 6,134,268 A | 10/2000 | McCoy | |
| 6,329,859 B1 | 12/2001 | Wu | |
| 6,359,486 B1 | 3/2002 | Chen | |
| 6,397,048 B1 | 5/2002 | Toda | |
| 6,404,525 B1 * | 6/2002 | Shimomura et al. | 398/82 |
| 6,498,694 B1 | 12/2002 | Shah | |
| 6,509,773 B2 | 1/2003 | Buchwald et al. | |
| 6,621,862 B1 * | 9/2003 | Dabell | 375/229 |
| 6,791,388 B2 | 9/2004 | Buchwald et al. | |
| 2002/0012152 A1 | 1/2002 | Agazzi et al. | |
| 2002/0039395 A1 | 4/2002 | Buchwald et al. | |
| 2002/0044617 A1 | 4/2002 | Buchwald et al. | |
| 2002/0044618 A1 | 4/2002 | Buchwald et al. | |
| 2002/0080898 A1 | 6/2002 | Agazzi et al. | |
| 2003/0086515 A1 * | 5/2003 | Reans et al. | |
| 2004/0212416 A1 | 10/2004 | Buchwald et al. | |

FOREIGN PATENT DOCUMENTS

| | | |
|---|---|---|
| EP | 0 515 074 | 11/1992 |
| EP | 0 805 447 A2 | 11/1997 |
| EP | 0 909 035 | 4/1999 |
| EP | 1 006 697 | 6/2000 |
| EP | 1 139 619 | 10/2001 |
| WO | WO 01/29991 | 4/2001 |
| WO | WO 01/54317 | 7/2001 |
| WO | WO 01/65788 | 9/2001 |
| WO | WO 01/84702 | 11/2001 |
| WO | WO 01/84724 | 11/2001 |
| WO | WO 02/13424 | 2/2002 |
| WO | WO 02/071616 | 9/2002 |

OTHER PUBLICATIONS

Sidiropoulos, S. and Horowitz, M., "A Semidigital Dual Delay-Locked Loop," IEEE Journal of Solid-State Circuits, IEEE, vol. 32, No. 11, Nov. 1997, pp. 1683-1692.

International Search Report issued Jan. 24, 2002, for Appln. No. PCT/US01/13613, 7 pages.

International Search Report issued Apr. 11, 2002, for Appln. No. PCT/US01/13637, 2 pages.

Black, Jr., W. and Hodges, D., "Time Interleaved Converter Arrays," IEEE Journal of Solid-State Circuits, IEEE, vol. SC-15, No. 6, Dec. 1980, pp. 1022-1029.

Conroy, C. et al., "An 8-b 85-MS/s Parallel Pipeline A/D Converter in 1-μm CMOS," IEEE Journal of Solid-State Circuits, IEEE, vol. 28, No. 4, Apr. 1993, pp. 447-454.

Dally, W. and Poulton, J., "Transmitter Equalization for 4Gb/s Signalling," Proceedings of Hot Interconnects IV, Palo Alto, CA, 1996, 10 pages.

Ellersick, W. et al., "A Serial-Link Transceiver Based on 8GSample/s A/D and D/A Converters in 0.25 μm CMOS," IEEE International Solid-State Circuits Conference, IEEE, 2001, pp. 58-59 and 430.

Ellersick, W. et al., "GAD: A 12-GS/s CMOS 4-bit A/D Converter for an Equalized Multi-Level Link," Symposium on VLSI Circuits Digest of Technical Papers, 1999, pp. 49-52.

Eklund, J-E. and Gustafsson, F., "Digital Offset Compensation of Time-Interleaved ADC Using Random Chopper Sampling," IEEE International Symposium on Circuits and Systems, IEEE, May 28-31, 2000, pp. III-447 thru III-450.

Fu, D. et al., "A Digital Background Calibration Technique for Time-Interleaved Analog-to-Digital Converters," IEEE Journal of Solid-State Circuits, IEEE, vol. 33, No. 12, Dec. 1998, pp. 1904-1911.

Guizani, M. and Al-Ali, A., "PC-Compatible Optical Data Acquisition Unit," Instrumentation and Measurement Technology Conference, IEEE, May 10-12, 1994, pp. 1099-1102.

Jenq, Y.-C., "Digital Spectra on Nonuniformly Sampled Signals: A Robust Sampling Time Offset Estimation Algorithm for Ultra High-Speed Waveform Digitizers Using Interleaving" Transactions on Instrumentation and Measurement, IEEE, vol. 39, No. 1, Feb. 1990, pp. 71-75.

Mason, R. and Taylor, J.T., "High-Speed Electro-Optic Analogue to Digital Converters," IEEE International Symposium on Circuits and Systems, IEEE, 1993, pp. 1081-1084.

Niewczas, P. et al., "Error Analysis of an Optical Current Transducer Operating with a Digital Signal Processing System," IEEE Transactions on Instrumentation and Measurement, IEEE, vol. 49, No. 6, Dec. 2000, pp. 1254-1259.

Petraglia, A. and Mitra, S., "Analysis of Mismatch Effects Among A/D Converters in a Time-Interleaved Waveform Digitizer," IEEE Transactions on Instrumentation and Measurement, IEEE, vol. 40, No. 5, Oct. 1991, pp. 831-835.

Agazzi, O., A Link Model for Equalized Optical Receivers, IEEE 802.3ae Equalization Ad Hoc Group, Mar. 11, 2001, 30 pages.

Agazzi, O. et al., DSP-Based Equalization for Optical Channels: Feasibility of a VLSI Implementation, IEEE 802.3ae, New Orleans, Sep. 12-14, 2000, 39 pages.

Agazzi, O. et al., Interim Observations on Multimode Optical Channels, IEEE 802.3ae—Equalization Ad Hoc, Tampa, Nov. 5, 2000, 29 pages.

Agazzi, O. et al., Measurements of DMD-Challenged Fibers at 3.125Gb/s, IEEE 802.3ae Equalization Ad Hoc, Jan. 10, 2001, 33 pages.

Agazzi, O. and Lenosky, T., "Measurement on Non-Stationarity of 10 Gb/s Multimode Fiber Links," Nov. 24, 2000, 5 pages.

Agazzi, O., 10 Gb/s PMD Using PAM-5 Modulation, IEEE 802.3, Dallas, Jan. 18-20, 2000, 19 pages.

Fettweis, G., "Parallel Viterbi Algorithm Implementation: Breaking the ACS-Bottleneck," IEEE Transactions on Communications, IEEE, vol. 37, No. 8, Aug. 1989, pp. 785-790.

Forney, Jr., G.D., "The Viterbi Algorithm," Proceedings of the IEEE, IEEE, vol. 61, No. 3, Mar. 1973, pp. 268-278.

Frazier, H., IEEE 802.3 Higher Speed Study Group, IEEE 802.3 HSSG, Kauai, Hawaii, Nov. 9, 1999, 24 pages.

Giaretta, G. and Lenosky, T., Adaptive Equalization of DMD Challenged Multimode Fiber at 1300 mm, IEEE P802.3ae Plenary, Mar. 11, 2001, 10 pages.

Hatamian, M. et al., "Design Considerations for Gigabit Ethernet 1000Base-T Twisted Pair Transceivers," IEEE 1998 Custom Integrated Circuits Conference, IEEE, 1998, pp. 335-342.

Isaacs, M et al., Measurements of Fiber Responses at 5 Gb/s Data Rate Using 850nm VCSELs, IEEE 802.3ae Equalization Ad Hoc, Mar. 11, 2001, 18 pages.

Kanno, N. and Ito, K., "Fiber-Optic Subcarrier Multiplexing Video Transport Employing Multilevel QAM," IEEE Journal on Selected Areas in Communications, IEEE, vol. 8, No. 7, Sep. 1990, pp. 1313-1319.

Kasper, B.L., "Equalization of Multimode Optical Fiber Systems," The Bell System Technical Journal, American Telephone and Telegraph Company, vol. 61, No. 7, Sep. 1982, pp. 1367-1388.

Kasturia, S. and Winters, J., "Techniques for High-Speed Implementation of Nonlinear Cancellation," IEEE Journal on Selected Areas in Communications, IEEE, vol. 9, No. 5, Jun. 1991, pp. 711-717.

Lenosky, T., *A Unified Method of Calculating PMD-induced Pulse Broadening*, IEEE 802.3ae Equalization Ad Hoc Meeting, Tampa, Florida, Nov. 5, 2000, 8 pages.

Lenosky, T. and Giaretta, G., *Five Gb/s Multimode DMD at 850 nm: Real-Time Data and Equalizer Simulations*, Finisar Corporation, Mar. 11, 2001, 13 pages.

Lenosky, T. et al., *Measurements of DMD-Challenged Fibers at 850nm and 2Gb/s Data Rate*, IEEE 802.3ae—Equalization Ad Hoc Group, Jan. 10, 2001, 21 pages.

Peral, E. et al., *Measurements of time variations in DMD-challenged multimode fiber at 1310nm for 10GE equalizer applications*, IEEE P802.3ae Equalization Ad Hoc, IEEE, Mar. 2001, 19 pages.

Personick, S.D., "Baseband Linearity and Equalization in Fiber Optic Digital Communication Systems,"*Bell System Technical Journal*, American Telephone and Telegraph Company, vol. 52, No. 7, Sep. 1973, pp. 1175-1194.

Personick, S.D., "Receiver Design for Digital Fiber Optic Communication System, I," *Bell System Technical Journal*, American Telephone and Telegraph Company, vol. 52, No. 6, Jul.-Aug. 1973, pp. 843-874.

Personick, S.D., "Receiver Design for Digital Optic Systems," *National Telecommunications Conference*, IEEE, Atlanta, Georgia, Nov. 26-28, 1973, vol. 1, pp. 8E-1-8E-4.

Vorenkamp, P. et al., *Analog Interface for 10-Gb/s Ethernet*, IEEE 802.3ae Task Force, Mar. 2000, 13 pages.

Winter, J. and Gitlin, R., "Electrical Signal Processing Techniques in Long-Haul Fiber-Optic Systems," *IEEE Transactions on Communications*, IEEE, vol. 38, No. 9, Sep. 1990, pp. 1439-1453.

Winters, J. et al., "Reducing the Effects of Transmission Impairments in Digital Fiber Optic Systems," *IEEE Communications Magazine*, IEEE, Jun. 1993, pp. 68-76.

*Progress Report on Equalization of Multimode Fibers*, IEEE 802.3ae Ad Hoc Group on Equalization, Jan. 12, 2001, 16 pages.

Alderrou, D. et al., *XAUI/XGXS Proposal*, IEEE 802.3ae Task Force, May 23-25, 2000, 28 pages.

Winters, J.H. and Gitlin, R., "Electrical Signal Processing Techniques in Long-Haul, Fiber-Optic Systems," *IEEE International Conference on Communications*, IEEE, vol. 1, Apr. 16-19, 1990, pp. 0397-0403.

Sauer-Greff, W. et al., *Maximum-Likelihood Sequence Estimation of Nonlinear Channels in High-Speed Optical Fiber Systems*, Apr. 6, 2001, Retrieved from the Internet at http://www.ftw.at/Dokumente/010406a.pdf, 29 pages.

Williamson, R.C. et al., "Effects of Crosstalk in Demulitplexers for Photonic Analog-to-Digital Converters," *Journal of Lightwave Technology*, IEEE, vol. 19, No. 2, Feb. 2001, pp. 230-236.

Yang, C-K., *Design Techniques for High-Speed Chip-to-Chip Links*, Retrieved from the Internet at http://web.doe.carleton.ca/courses/97578/topic5/Tutorial_SerialLink.pdf, 31 pages, 2000.

Yang, C-K. et al., "A Serial-Link Transceiver Based on 8-Gsamples/s A/D and D/A Converters in 0.25-µm CMOS," *IEEE Journal of Solid-State Circuits*, IEEE, vol. 36, No. 11, Nov. 2001, pp. 1684-1692.

Zuoxi, T., "Implementation of a Digital Multibeam Receiver Based on TMS320C80 for Laser Optoacoustic Remote Sensing," *Proceedings of ICSP2000*, IEEE, 2000, pp. 2082-2084.

Agazzi, O. and Lenosky, T., *Algorithm to Postprocess Measured Data*, IEEE 802.3ae Equalization Ad Hoc Group, Jan. 10, 2001, 11 pages.

Agazzi, O. et al., *10 Gb/s PMD Using PAM-5 Trellis Coded Modulation*, IEEE 802.3, Alburquerque, Mar. 6-10, 2000, 38 pages.

Bhatt, V., *Equalization Ad Hoc Concluding Report*, IEEE P802.3ae Plenary, Mar. 2001, 12 pages.

Bingham, J.A.C., "Multicarrier Modulation for Data Transmission: An Idea Whose Time Has Come," *IEEE Communications Magazine*, IEEE, vol. 28, No. 5, pp. 5-8 and 11-14, May 1990.

Chiddix, J. et al., "AM Video on Fiber in CATV Systems: Need and Implementation," *IEEE Journal on Selected Areas in Communications*, IEEE, vol. 8, No. 7, Sep. 1990, pp. 1229-1239.

Darcie, T., "Subcarrier Multiplexing for Lightwave and Video Distribution Systems," *IEEE Journal on Selected Areas in Communications*, IEEE, vol. 8, No. 7, Sep. 1990, pp. 1240-1248.

Fettweis, G., "High-Rate Viterbi Processor: A Systolic Array Solution," *IEEE Journal on Selected Areas in Communications*, IEEE, vol. 8, No. 8, Oct. 1990, pp. 1520-1534.

Lenosky, T. et al., *Measurements of DMD-Challenged Fibers at 1310nm and 1Gb/s Data Rate*, IEEE 802.3ae—Equalization Ad Hoc Group, Jan. 10, 2001, 21 pages.

Liu, M-K. and Modestou, P., "Multilevel Signaling and Pulse Shaping for Spectrum Efficiency in Subcarrier Multiplexing Transmission," *IEEE Journal of Lightwave Technology*, IEEE, vol. 12, No. 7, pp. 1239-1246, Jul. 1994.

Olshansky, R. et al., "Subcarrier Multiplexed Coherent Lightwave Systems for Video Distribution," *IEEE Journal on Selected Areas in Communications*, IEEE, vol. 8, No. 7, Sep. 1990, pp. 1268-1275.

Olshansky, R. et al., "Subcarrier Multiplexed Lightwave Systems for Broadband Distribution," *Journal of Lightwave Technology*, IEEE, vol. 7, No. 9, Sep. 1989, pp. 1329-1341.

Otte, S. and Rosenkranz, W., "A Decision Feedback Equalizer for Dispersion Compensation in High Speed Optical Transmission Systems," *international Conference on Transparent Optical Networks*, IEEE, 1999, pp. 19-22.

Parhi, K. et al., *Parallel Implementation of the DSP Functions of the PAM-5 10Gb/s Transceiver*, IEEE 802.3ae Task Force, Mar. 2000, 12 pages.

\* cited by examiner

Serial-to-Parallel Receiver

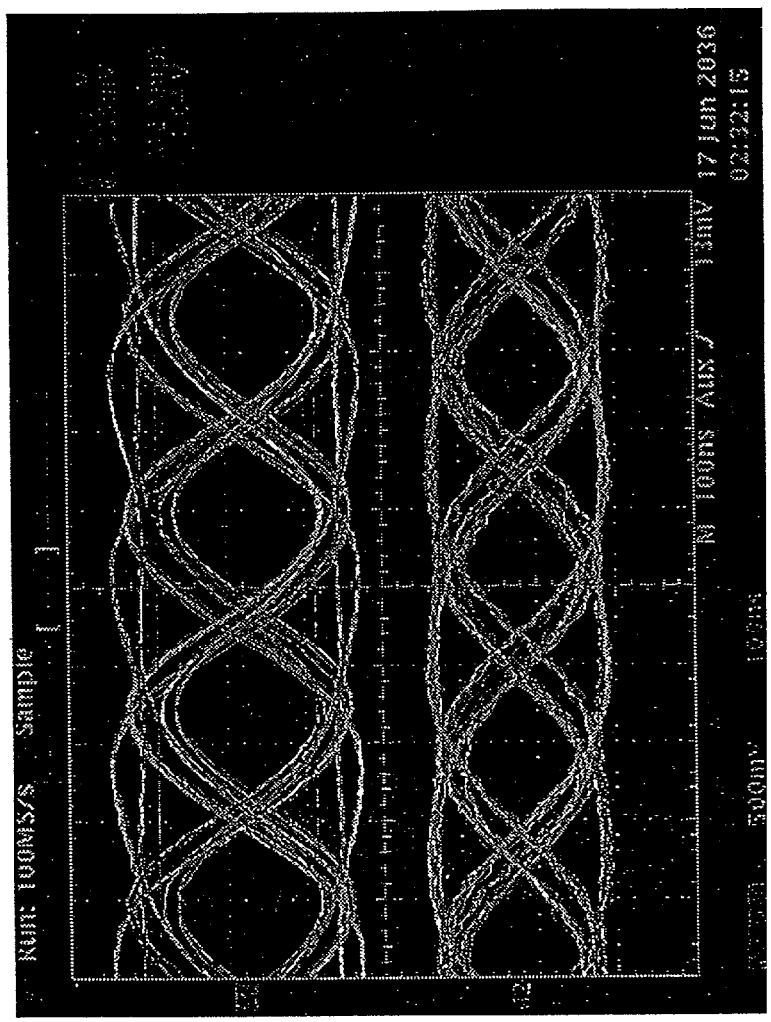

METHODS AND SYSTEMS FOR ADAPTIVE RECEIVER EQUALIZATION

CROSS-REFERENCE TO RELATED APPLICATIONS

This application claims priority to U.S. Provisional Application No. 60/200,813, filed Apr. 28, 2000, entitled "High-Speed Serial Transceiver," incorporated herein by reference in its entirety.

STATEMENT REGARDING FEDERALLY-SPONSORED RESEARCH AND DEVELOPMENT

Not applicable.

REFERENCE TO MICROFICHE APPENDIX/SEQUENCE LISTING/TABLE/COMPUTER PROGRAM LISTING APPENDIX (submitted on a compact disc and an incorporation-by-reference of the material on the compact disc)

Not applicable.

BACKGROUND OF THE INVENTION

1. Field of the Invention

The present invention is directed to analog signal receivers and, more particularly, to methods and systems for equalizing (e.g., minimizing distortions within) analog data signals.

2. Background Art

Conventional signal propagation mediums, such as conventional backplane material (e.g., FR4) and conventional wires (e.g., IEEE 1394 "firewire)," are generally suitable for lower data rate signals, up to about 622 megabits per second. At higher frequencies, however, data signals are increasingly subject to frequency band-limiting distortions such as inter-symbol interference.

Inter-symbol interference results, in part, from unsettled response times following signal state changes. In other words, when a first state change does not settle before a second state change, the state changes can begin to overlap and can become more difficult to distinguish from one another.

A conventional approach compensates for inter-symbol interference with pre-emphasis, which boosts signal amplitudes prior to transmission. Pre-emphasis techniques typically require prior knowledge of signal paths. When an integrated circuit ("IC") is intended to be used in multiple systems, the IC needs to be pre-programed for various system characterizations. This is costly, time-consuming, and inefficient. Pre-emphasis also typically causes electromagnetic interference problems such as impedance mismatching and other reflective problems.

What is needed is a method and system for minimizing frequency band-limiting distortions, such as inter-symbol interference, in analog data signals. What is also needed is a method and system for adaptively minimizing frequency band-limiting distortions, such as inter-symbol interference, in analog data signals.

BRIEF SUMMARY OF THE INVENTION

The present invention is directed to methods and systems for minimizing distortions in an analog data signal at a receive end.

In an embodiment, the invention adapts equalization parameters to a signal path associated with the analog data signal. Adaptive control logic is implemented with analog and/or digital components.

In an embodiment, the invention equalizes a discreet-time analog representation of an analog data signal. In an embodiment, the invention equalizes a discreet-time analog representation of an analog data signal using digital controls.

In an embodiment, a resultant equalized analog data signal is digitized.

In an example implementation, an analog data signal is sampled, a quality of the samples is measured, and one or more equalization parameters are adjusted with digital controls as needed to minimize distortion of the samples. The equalized samples are then digitized.

The present invention is suitable for lower rate analog data signals and multi-gigabit data rate analog signals.

BRIEF DESCRIPTION OF THE DRAWINGS/FIGURES

FIG. 13A is an example eye diagram for a 3.125 gigabits per second analog data signal after propagation through thirty-six inches of conventional FR4 backplane material, after analog receive equalization is performed in accordance the present invention;

FIG. 13B is an example eye diagram for a 3.125 gigabits per second analog data signal after propagation through twenty-five feet of IEEE 1394 "firewire," after equalization is performed in accordance with the present invention;

Figure 29:
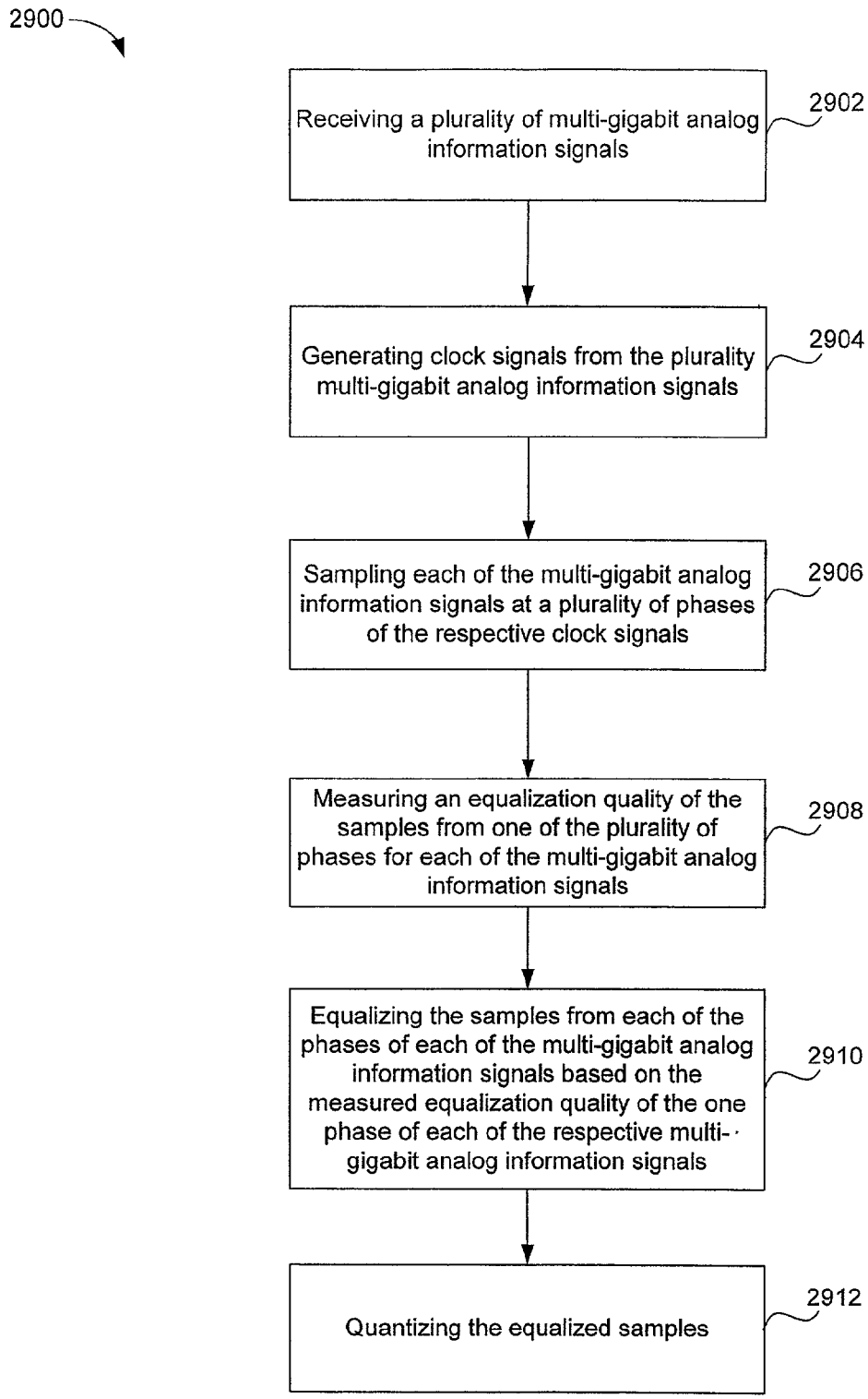
Figure 30:
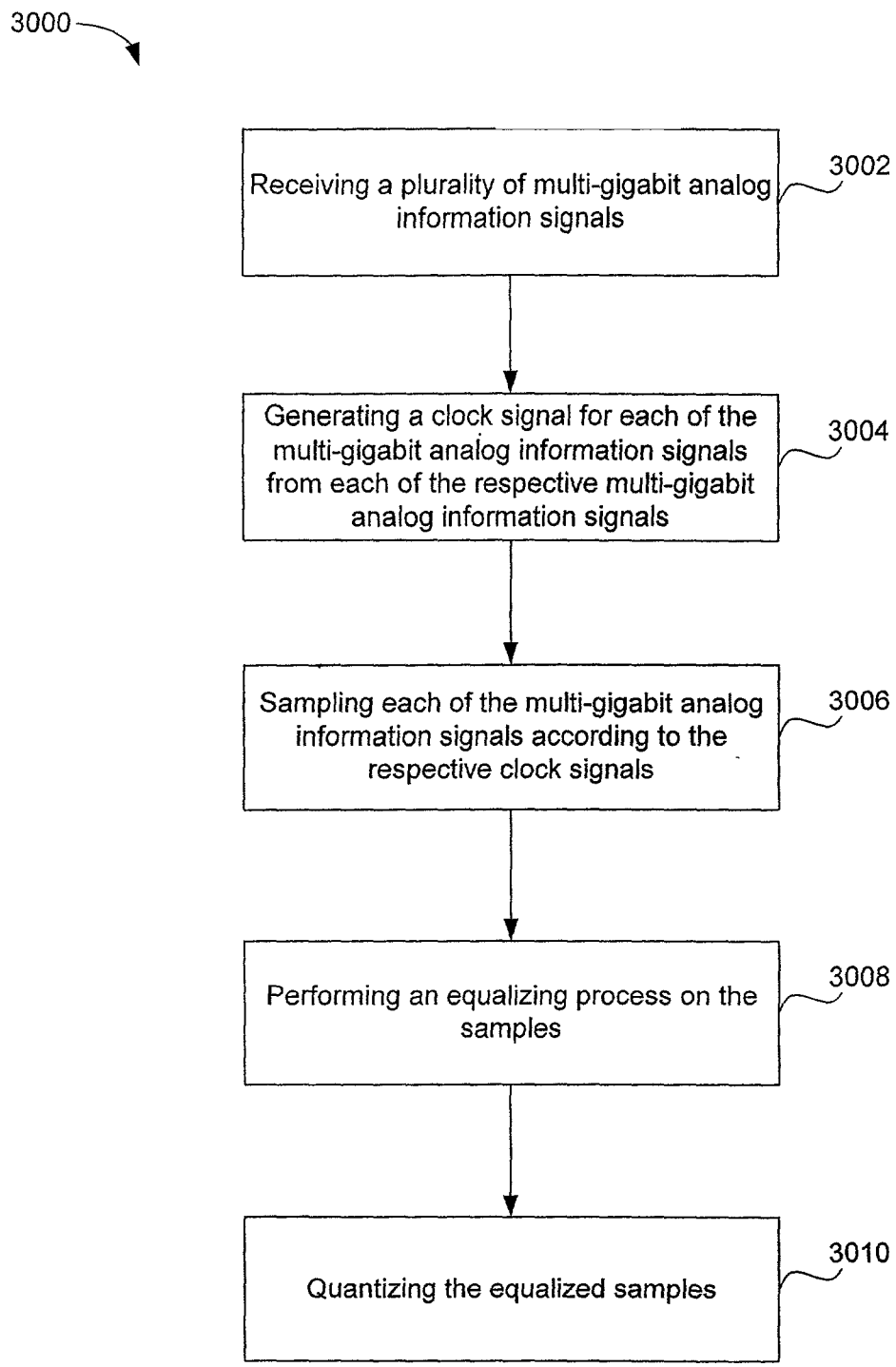

FIG. 29 is an example process flowchart for adaptively equalizing a plurality of time-staggered portions of multiple information signals for their respective signal paths, in accordance with an aspect of the present invention; and FIG. 30 is an example process flowchart for adaptively equalizing a plurality of analog information signals for their respective signal paths, in accordance with an aspect of the present invention.

DETAILED DESCRIPTION OF THE INVENTION

Table of Contents

I. Introduction
II. Analog Equalization
III. Adaptive Equalization Control
IV. Example Equalizer Embodiments
V. Discreet-Time Analog Equalization
VI. Example Implementations of the Quality Measuring and Adaptive Control Module
VII. Multi-Path Adaptive Equalization
VIII. Implementation in Example Environments
IX. Example Methods for Adaptive Equalization
X. Conclusions I. Introduction Conventional backplane materials, such as FR4, and conventional wires such as IEEE 1494 "firewire," are suitable for lower data rates up to about 622 megabits per second. At higher data rates, however, data signals are increasingly subject to frequency band-limiting distortion, such as inter-symbol distortion, inter-channel interference, attenuation, cross-talk, etc.

Figure 11:
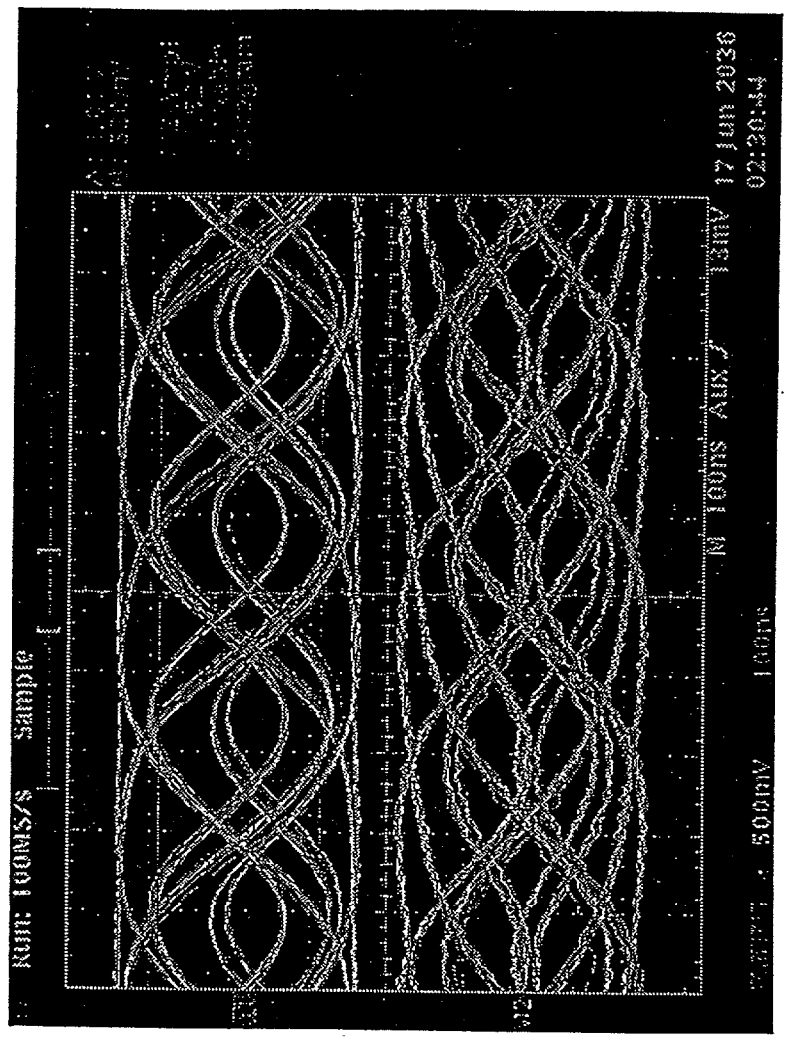
FIG. 11A is an example eye diagram for a 3.125 gigabits per second analog data signal after propagation through thirty-six inches of conventional FR4 backplane material.
FIG. 11B is an example eye diagram for a 3.125 gigabits per second analog data signal after propagation through twenty-five feet of IEEE 1394 "firewire;"

FIG. 11A is an example eye diagram for a 3.125 gigabits per second analog data signal after propagation through thirty-six inches of conventional FR4 backplane material.

FIG. 11B is an example eye diagram for a 3.125 gigabits per second analog data signal after propagation through twenty-five feet of IEEE 1394 "firewire."

Figure 1:
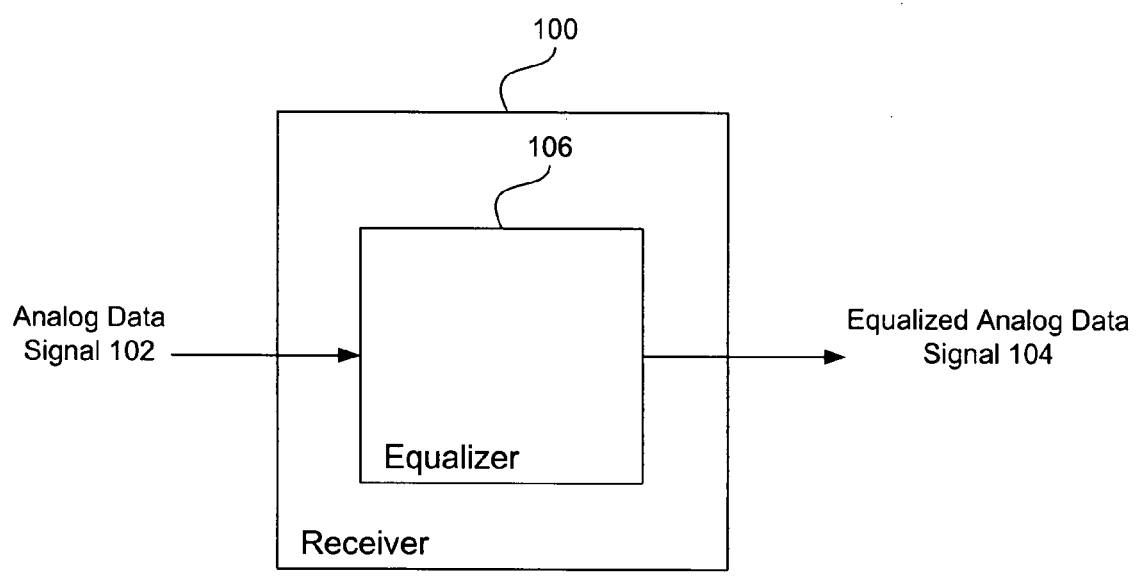
FIG. 1 is a high level block diagram of an example analog data receiver 100 in accordance with an aspect of the present invention.

Signals corresponding to the eye diagrams as illustrated in FIGS. 1 IA and 11B are difficult to digitize because of the excessive inter-symbol distortion.

In accordance with the invention, inter-symbol distortion of an analog data signal is minimized through equalization of the received analog data signal. In other words, the present invention opens the eye of the received analog data signal.

Figure 12:
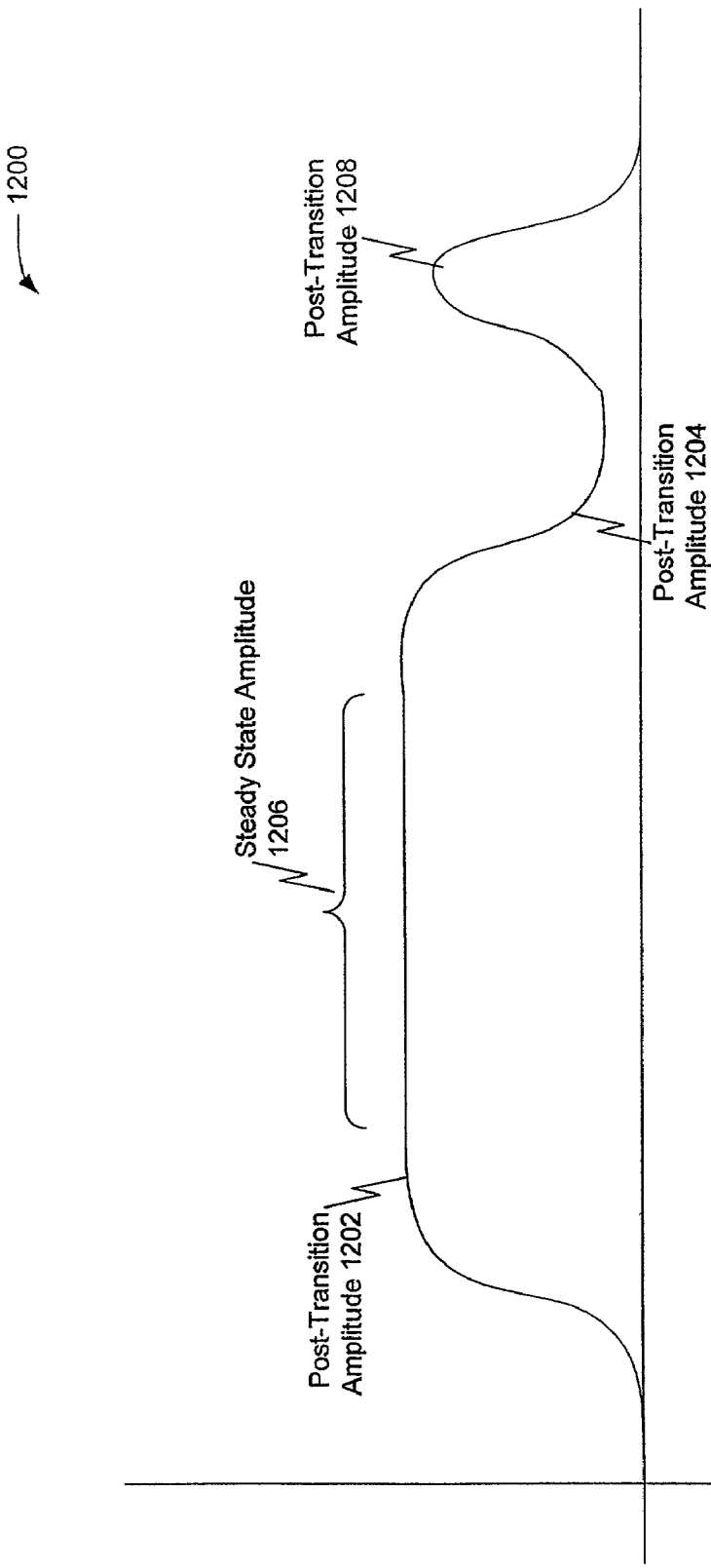
FIG. 12 illustrates an example non-return-to-zero ("NRZ") analog data signal.

Similarly, FIG. 12 is an example non-return-to-zero ("NRZ") analog data signal 1200. Inter-symbol distortion is evident in post transition amplitude 1204, which does not have time to reach zero, and post transition amplitude 1208, which does not have time to reach the steady state amplitude 1206.

In accordance with the present invention, analog receive equalization minimizes differences between amplitudes of the analog data signal 1200 just after transitions (e.g., 1202, 1204), and amplitudes of the analog data signal at steady state (e.g., 1206).

FIG. 13A is an example eye diagram for a 3.125 gigabits per second analog data signal after propagation through thirty-six inches of conventional FR4 backplane material, after analog receive equalization is performed in accordance with the present invention.

FIG. 13B is an example eye diagram for a 3.125 gigabits per second analog data signal after propagation through twenty-five feet of IEEE 1394 "firewire," after analog receiver equalization is performed in accordance with the present invention.

II. Analog Equalization

An analog data receiver in accordance with the present invention can be implemented in one or more of a variety of receiver environments. Various example receiver environments are illustrated and/or described herein in which the present invention can be implemented. The present invention is not, however, limited to the example environments illustrated and/or described herein. Based on the illustrations and description herein, one skilled in the relevant art(s) will understand that the present invention can be implemented in other environments and systems as well. Such other environments and systems are within the scope of the present invention.

FIG. 1 is a high level block diagram of an example analog data receiver 100, including an equalizer 106, in accordance with the present invention. The example analog data receiver 100 receives an analog data signal 102. The analog data signal 102 can include higher rate analog data signals, such as, without limitation, multi-gigabit (e.g. 3 GHz) analog data signals. The equalizer 106 equalizes the analog data signal 102 and outputs an equalized analog data signal 104.

In an embodiment, the equalizer 106 is adapts in real time to a signal path associated with the analog data signal 102, and/or to changing distortions. Alternatively, the equalizer 106 is implemented to provide a fixed amount of equalization.

In an embodiment, the equalizer 106 adapts to minimize inter-symbol distortion that arises from various transmission paths including, without limitation, various lengths of IEEE 1394 "firewire," FR4 backplane material, and other conventional and non-conventional sources of inter-symbol distortion. In an adaptive implementation, the equalizer 106 does not require prior knowledge of signal paths and thus can be utilized in a variety of conventional systems without substantial re-design of the existing systems.

In an embodiment, the equalizer 106 is implemented with one or more filters. Generally, filters designed for high data rate analog signals are expensive to implement. However, the present invention provides adaptive hybrid analog/digital high data rate filtering methods and systems that are uncomplicated and inexpensive to implement.

The equalizer 106 is suitable for non-return to zero ("NRZ") protocols as well as other protocols.

In an embodiment, the receiver 100 outputs the equalized analog data signal 104. Alternatively, or additionally, the receiver 100 converts the equalized analog data signal 104 to one or more digital signals which can include, without limitation, one or more serial digital data signals and/or one or more parallel digital data signals.

Figure 2:
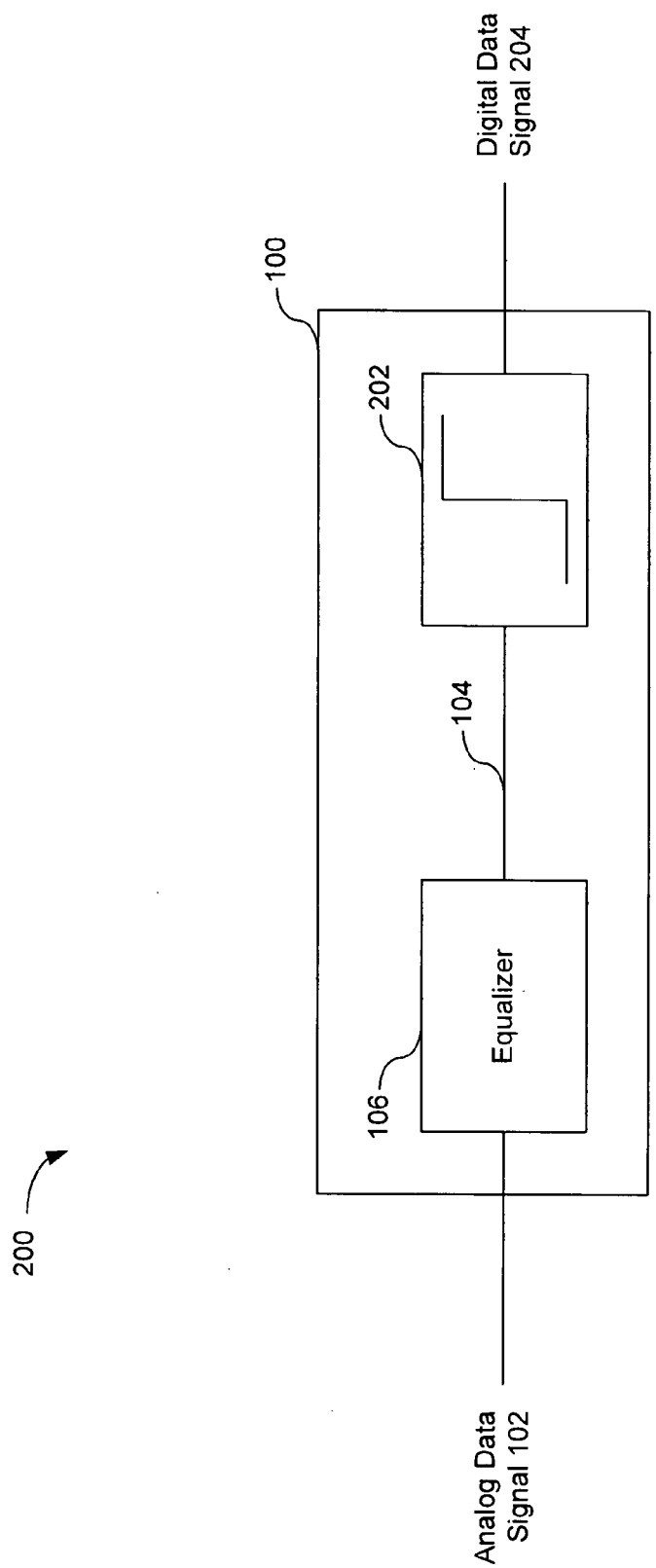
FIG. 2 is a block diagram of an example embodiment of the analog data receiver illustrated in FIG. 1.

For example, FIG. 2 is a block diagram of an example embodiment of the analog data receiver 100 further including an optional quantizer 202, which over-samples the quantized analog data signal 104 to convert it to the one or more digital data signals 204. Based on the description herein, one skilled in the relevant art(s) will understand that the quantizer 202, and/or other digitizing methods and/or systems, can be implemented as one or more of a variety of conventional quantizers.

The optional quantizer 202, and/or other digitizing methods and/or systems, can be utilized in a variety of receiver embodiments including, without limitation, receiver embodiments described and/or illustrated herein. However, the present invention can be implemented without digitizing the equalized analog signal 104.

In an embodiment, the equalizer 106 operates directly on the analog data signal 102. Alternatively, the equalizer 106 operates on discreet-time analog "slices" or "samples" of the analog data signal 102. Because each slice or sample is a substantially constant analog level, the optional equalizer 202 equalizes higher data rate signals as well as lower data rate signals. Methods and systems for discreet-time equalization of the analog data signal 102 are described below.

Figure 3:
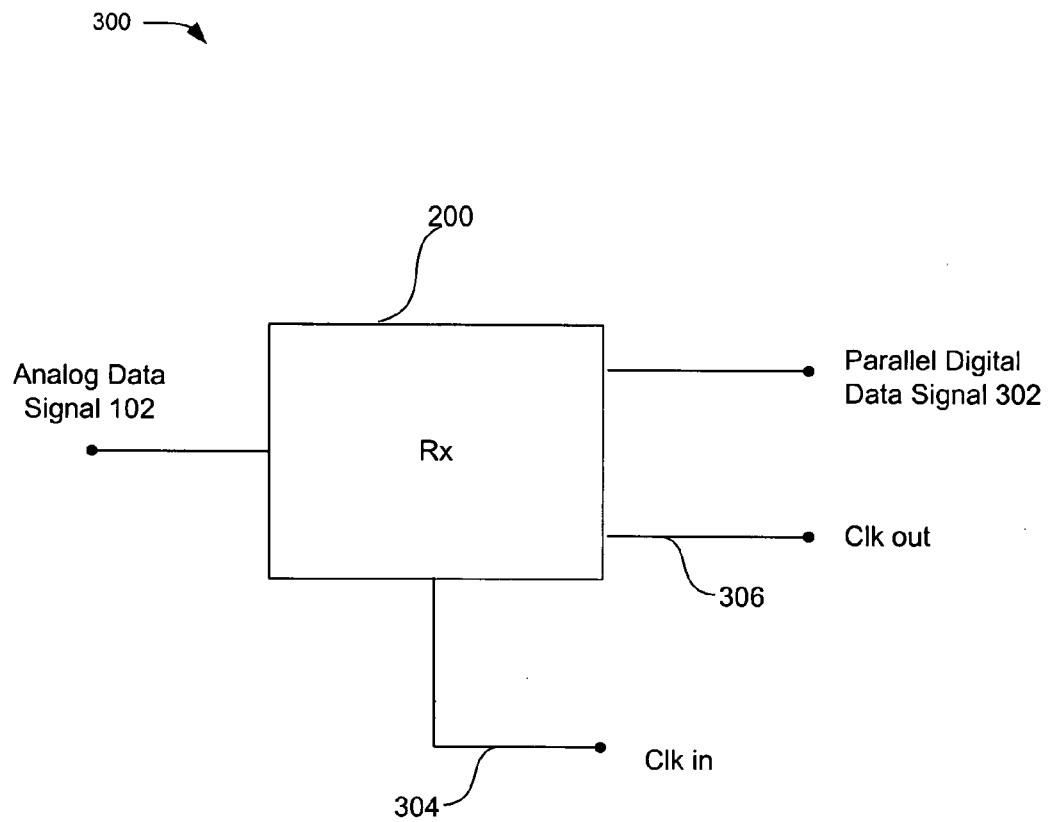
FIG. 3 is a block diagram of an example serial-to-parallel analog data receiver in accordance with an aspect of the present invention.

FIG. 3 is a block diagram of an example serial-to-parallel analog data receiver 300 implementation of the receiver 200, which outputs a parallel digital data signal 302. The serial-to-parallel analog data receiver 300 also receives a clock signal 304 and outputs a clock signal 306.

Figure 4:
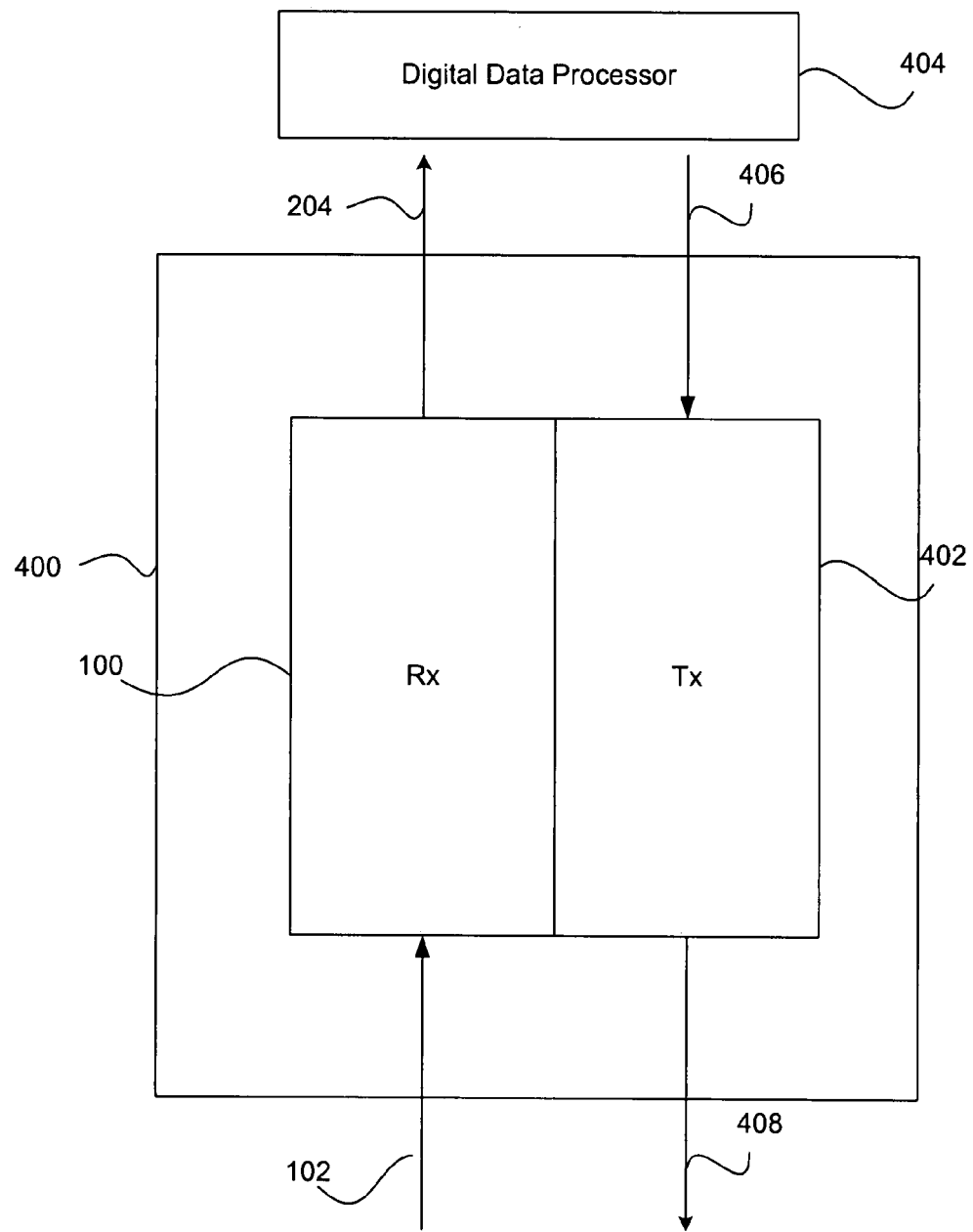
FIG. 4 is a block diagram of an example transceiver in accordance with an aspect of the present invention.

The present invention can be implemented within a variety of types of transceivers. FIG. 4 is a block diagram of an example transceiver 400 that includes the analog data receiver 100 and an analog data transmitter 402.

In a typical implementation, the analog receiver 100 receives and equalizes the analog data signal 102 and optionally converts it to one or more digital data signals 204. The one or more digital data signals 204 are provided to a digital data processor 404, which can include, without limitation, logic, computer program instructions, digital signal processing hardware and/or software, routing hardware and/or software, and the like.

One or more digital data signals 406 are provided to the analog data transmitter 402, which converts the one or more digital data signals 406 to one or more analog data signals 408.

Figure 5:
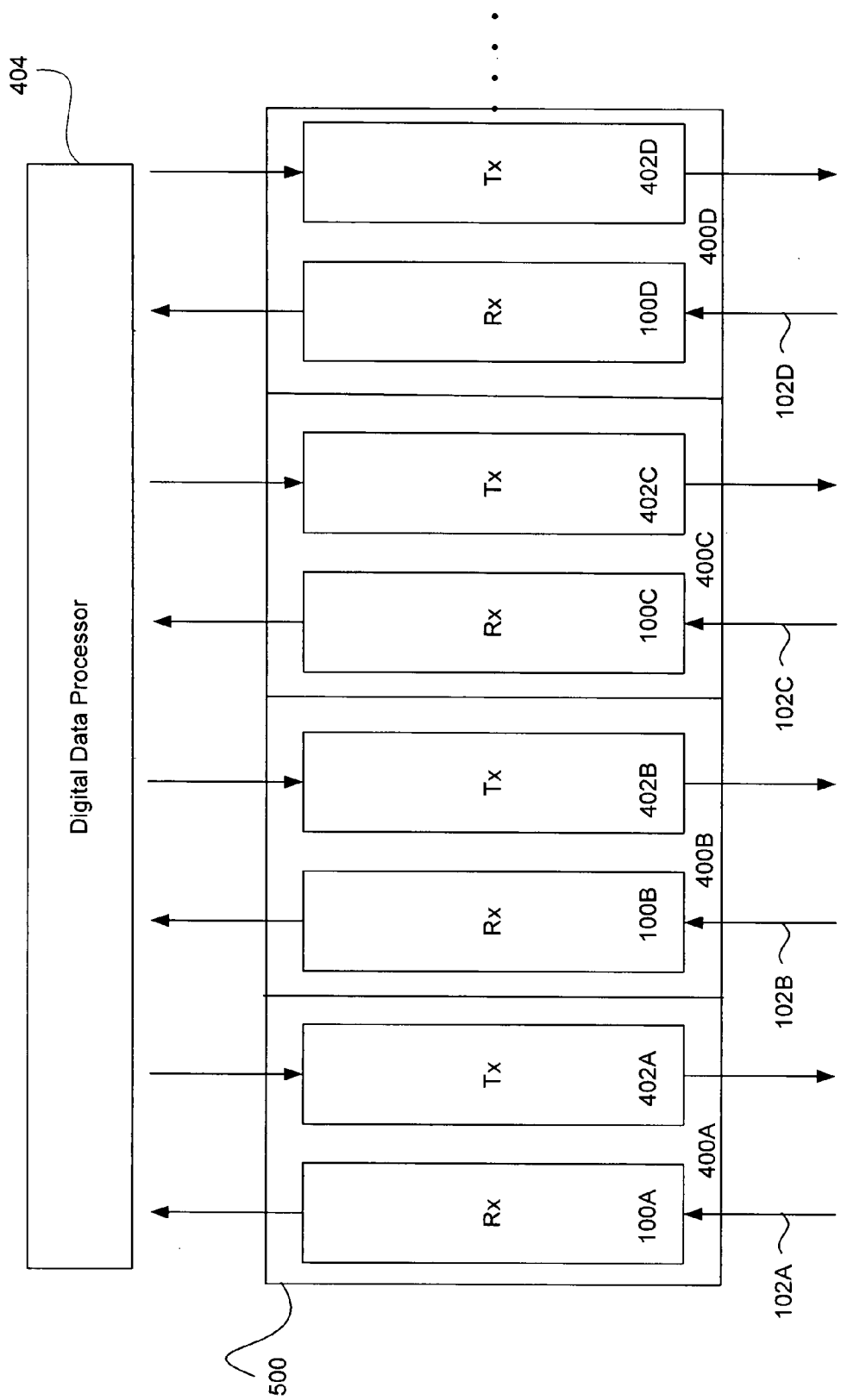
FIG. 5 is a block diagram of a multi-channel implementation of a receiver, in accordance with an aspect of the present invention.

FIG. 5 is a parallel transceiver 500 implementation of the transceiver 400, wherein multiple transceivers 400A-400D are implemented in parallel. Each analog signal 102A-102D is referred to herein as a channel. Thus, the parallel transceiver 500 is referred to herein as a multi-channel transceiver. In an embodiment, multiple parallel transceivers 500 are implemented on a single integrated circuit ("IC").

Figure 6:
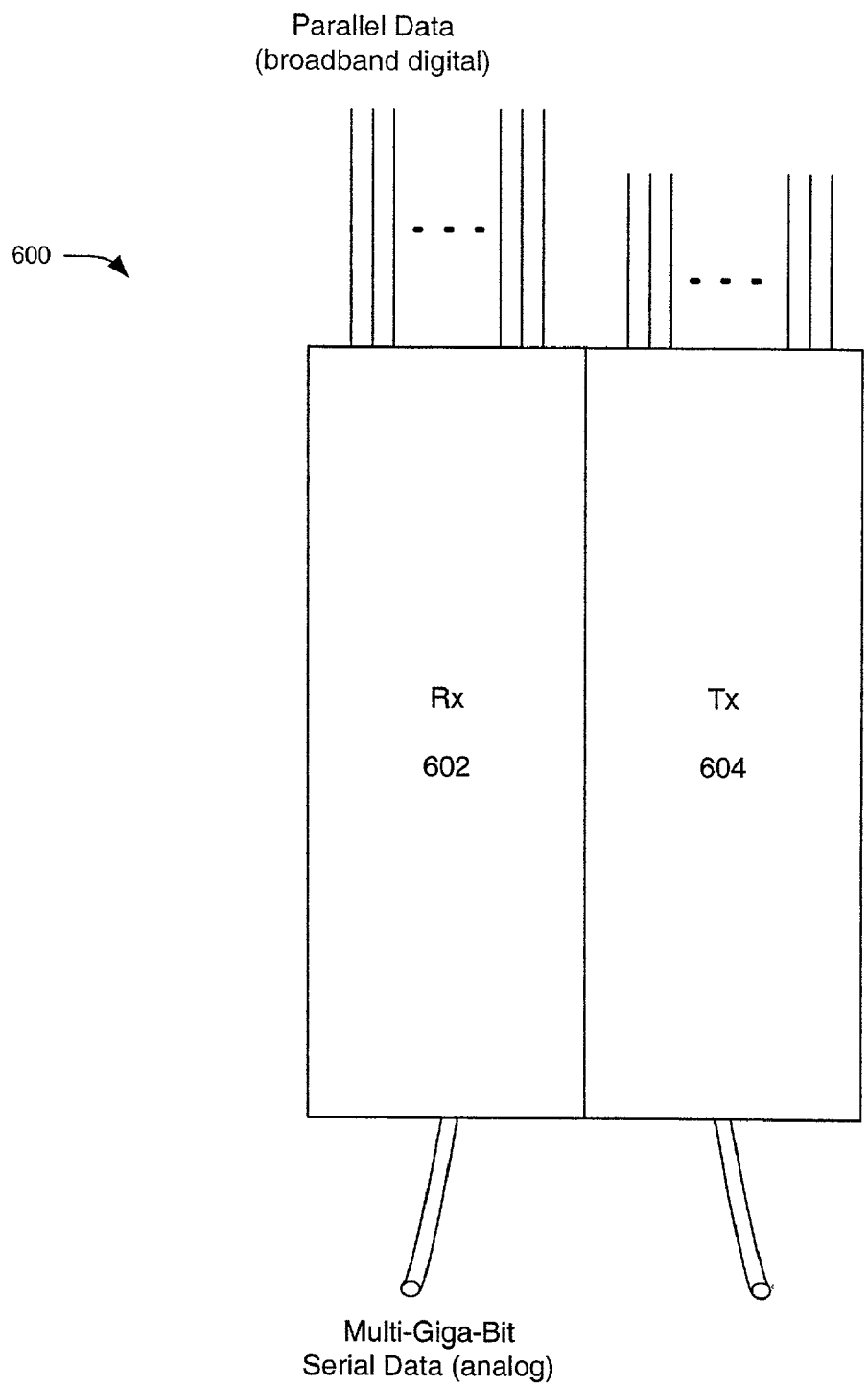
FIG. 6 is a block diagram of the example transceiver illustrated in FIG. 4.

FIG. 6 is a block diagram of the example transceiver 400 implemented as an example multi-gigabit serial analog-to-parallel digital data transceiver 600, including a multi-gigabit serial-to-parallel analog data receiver 602 and a multi-gigabit parallel-to-serial analog data transmitter 604. The multi-gigabit serial-to-parallel transceiver 600 can be implemented as illustrated in FIG. 4 and/or FIG. 5.

Figure 7:
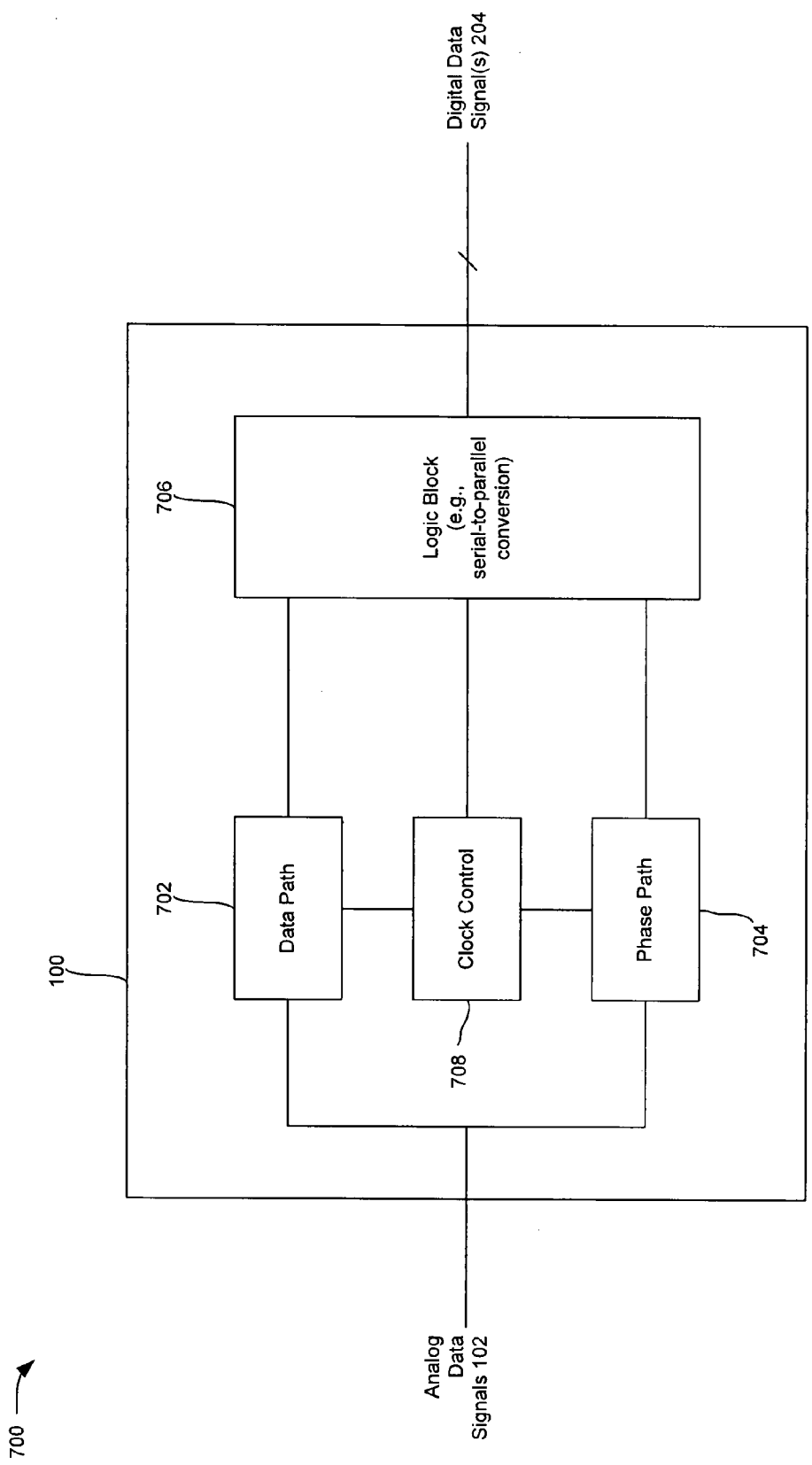
FIG. 7 is an example dual-path receiver implementation of the analog data receiver illustrated in FIG. 1.

FIG. 7 is an example dual-path receiver 700 implementation of the analog data receiver 100. The dual-path receiver 700 includes a data path 702 and a phase path 704. The data path 702 provides data recovery. The phase path 704, in combination with a logic block 706 and a clock control block 708, provides clock recovery and clock control for the data path 702. The phase path 704, the logic block 706, and the clock control block 708, are described in one or more of:

U.S. provisional application titled, "High-Speed Serial Transceiver," Ser. No. 60/200,813, filed Apr. 28, 2000;

U.S. non-provisional patent application titled, "Phase Interpolator Device and Method," Ser. No. 09/844,266 filed Apr. 30, 2001;

U.S. non-provisional patent application titled, "Timing Recovery and Phase Tracking System and Method," Ser. No. 09/844,296 filed Apr. 30, 2001;

U.S. non-provisional patent application titled, "Timing Recovery and Frequency Tracking System and Method," Ser. No. 09/844,432 filed Apr. 30, 2001; and U.S. non-provisional patent application titled, "High-Speed Serial Data Transceiver and Related Methods," Ser. No. 09/844,441 filed Apr. 30, 2001;

all of which are incorporated herein by reference in their entireties.

In an embodiment, the present invention is implemented in a multi-data-path environment including, without limitation, staggered-timing multi-path embodiments. Staggered-timing multi-path embodiments are useful, for example, where the analog data signal 102 is a higher data rate analog signal (e.g., multi-gigabit data rate signal).

Figure 8:
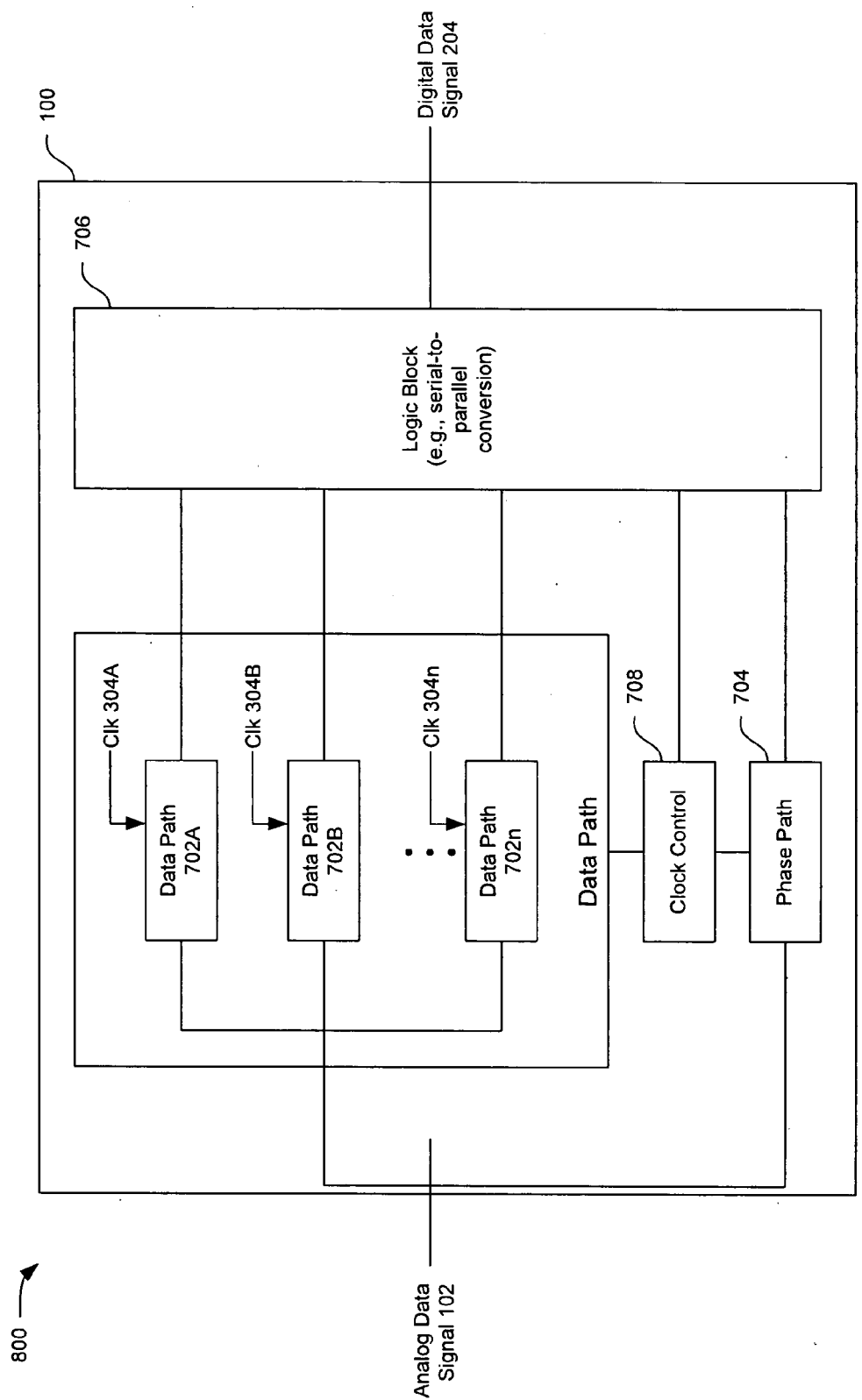
FIG. 8 is a block diagram of an example multi-path receiver implementation of the analog data receiver illustrated in FIG. 1.

For example, FIG. 8 is a block diagram of an example multi-data-path receiver 800 implementation of the analog data receiver 100, including multiple data paths 702A-n. In an embodiment, the multiple data paths 702A-n are operated in a time staggered fashion. Multi-data-path time-staggered operation is useful where, for example, the data rate of the analog data signal 102 is too high for a single data path 702 to handle.

Figure 9:
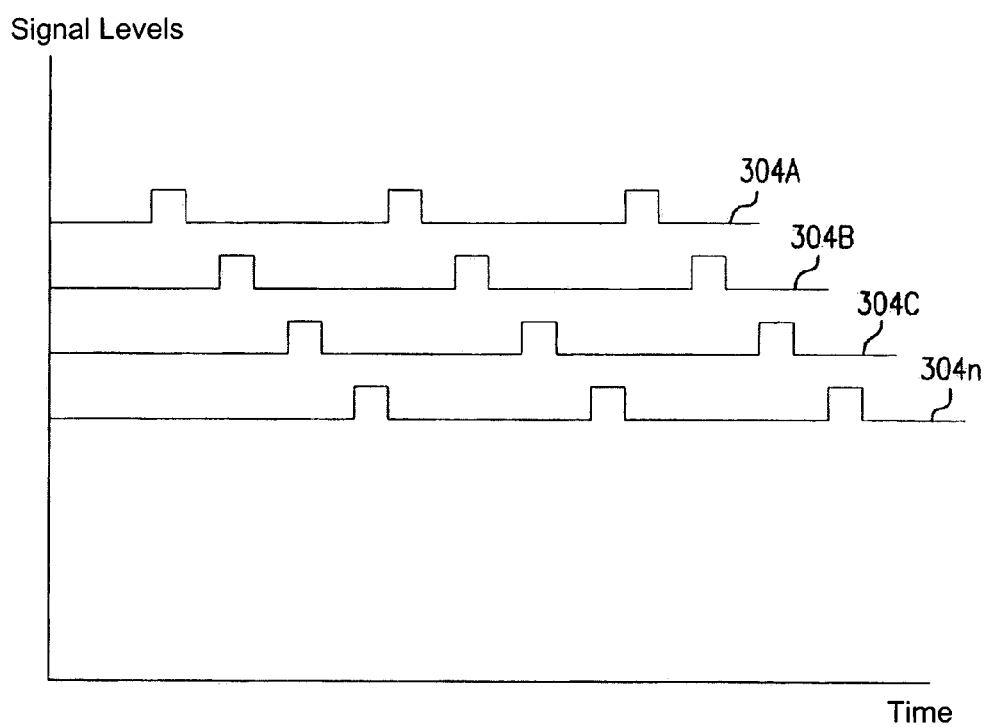
FIG. 9 illustrates example clocking signals in accordance with an aspect of the present invention.

Referring to FIG. 9, in an example staggered sampling embodiment, the multiple data paths 702A-n are provided with example clocking signals 304A-n, which are staggered in time with respect to one another.

Referring back to FIG. 8, in an embodiment, each data path 702A-n includes an optional quantizer 202 (FIG. 2) and each data path 702A-n digitizes a different portion of the analog data signal 102. Outputs of the multiple data paths 702A-n are provided to the logic block 706. The logic block 706 performs sequencing and alignment operations to the outputs from the multiple data paths 702A-n according to an staggered timing scheme. The staggered timing scheme can be any of a variety of conventional staggered timing schemes. In a staggered sampling embodiment, a corresponding phase path 704 is typically provided for each data path 702.

In an embodiment, the present invention is implemented as a signal router. A signal router can be used to route one or more information signals between a plurality of components.

Figure 10:
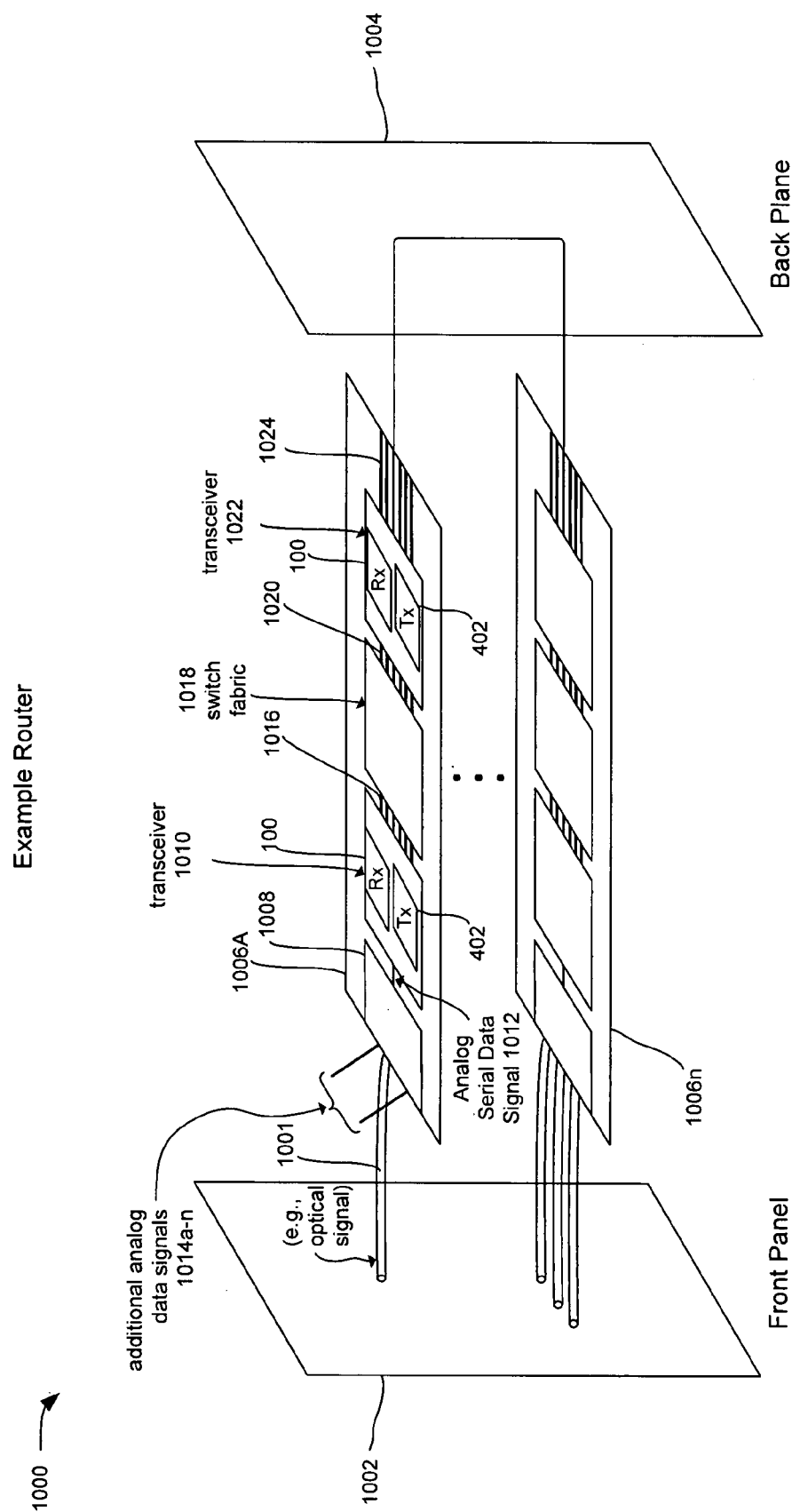
FIG. 10 is a block diagram of an example router in accordance with an aspect of the present invention.

FIG. 10 is an example router 1000, including a front panel 1002, a backplane 1004 and one or more interfacing circuit boards 1006. Front panel 1002 typically includes a plurality of connectors or "jacks," to which external devices, such as computers, servers, terminals, communications devices, other routers, and the like, can be coupled. The router 1000 receives and transmits (i.e., routes) signals, typically between the external devices. The signals can be electrical and/or optical signals.

Each interfacing circuit board 1006 includes a finite number of connections to the front panel 1002 for receiving and/or transmitting signals from/to external devices. Additional interfacing circuit boards 1006 can be utilized to accommodate additional external devices. The backplane 1004 permits the router 1000 to route signals between multiple interfacing circuit boards 1006. In other words, the backplane 1004 permits the router 1000 to route signals between external devices that are coupled to different interfacing circuit boards 1006.

Interfacing circuit boards 1006 can include a variety of digital and/or analog components. When multiple interfacing circuit boards 1006 are utilized, two or more of them can be similar and/or dissimilar. The interfacing circuit boards 1006 illustrated in FIG. 10 are provided for illustrative purposes only. Based on the description herein, one skilled in the relevant art(s) will understand that additional and/or alternative components/features can be provided with the interfacing circuit boards 1006.

Example interfacing circuit board 1006A is now described. Interfacing circuit board 1006A optionally includes one or more interface components 1008 that receive and/or buffer one or more signals received from external devices through the front panel 1002. In the illustrated example, the interface component 1008 receives an optical signal 1001 from the front panel 1002. Accordingly, in this embodiment, interfacing component 1008 includes one or more optical converters that convert the optical signal 1001 to an electrical analog data signal, illustrated here as an analog serial data signal 1012. Additionally, or alternatively, interfacing component 1008 sends and/or receives one or more other analog data signals 1014A-n to/from other external devices through the front panel 1002. Additionally, or alternatively, interfacing component 1008 sends and/or receives one or more of the signals 1014A-n to/from somewhere other than the front panel 1002.

The serial analog data signal 1012 is provided from the interfacing component 1008 to a transceiver 1010, which can be implemented as one or more of transceivers 400 (FIG. 4), 500 (FIG. 5) and/or 600 (FIG. 6). Transceiver 1010 permits the router 1000 to both receive and transmit analog serial data 1012 from and/or to external devices.

Within the transceiver 1010, one or more receivers 100 equalizes and converts the serial analog data signal 1012 to one or more digital data signals, illustrated here as parallel digital data signals 1016. In an example embodiment, one or more receivers 100 within the transceiver 1010 converts the analog serial data signal 1012 to four ten bit words.

The parallel digital data signals 1016 are optionally provided to a switch fabric 1018, which can be a programmable switch fabric. The optional switch fabric 1018 provides any of a variety of functionalities.

The optional switch fabric 1018 outputs parallel digital data signals 1020 to second transceiver 1022, which can be implemented as one or more of transceivers 400 (FIG. 4), 500 (FIG. 5) and/or 600 (FIG. 6). A transmitter 402 within the transceiver 1022 converts the parallel digital data signals 1020 to serial analog data signals 1024 and transmits them across the backplane 1004 to one or more other interface circuit boards 1006n, and/or back to interface circuit board 1006A.

One or more receivers 100 within the transceiver 1022 receives analog data signals 1024 from the backplane 1004, digitizes them, and converts them to parallel digital data signals 1020. The parallel digital data signals 1020 are provided to the switch fabric 1018, which provides any of a variety of functionalities. The switch fabric 1018 outputs parallel digital data signals 1016 to one or more transmitters 402 within the transceiver 1010, which converts them to analog data signals for transmission to an external devices, possibly through the interface component 1008 and the front panel 1002.

Additional interface circuit boards 1006n operate in a similar fashion. Alternatively, one or more of the interface circuit boards 1006A-n are configured with more or less than the functionality described above. For example, in an embodiment, one or more of the interface circuit boards 1006A-n are configured to receive analog data signals from the front panel 1002 and to provide them to the backplane 1004, but not to receive analog data signals 1024 from the backplane 1004. Alternatively, or additionally, one or more of the interface circuit boards 1006A-n are configured to receive analog data signals 1024 from the backplane 1004 and provide them to the front panel 1002, but not to receive analog data signals from the front panel 1002.

III. Adaptive Equalization Control

In an embodiment, equalization parameters adapt in real time. This permits a receiver to adapt to a variety of signal paths. This also permits multiple parallel receivers to independently adapt to their respective associated signal paths. In FIG. 10, for example, in an embodiment, multiple receivers 100 are implemented within transceiver 1022 for receiving analog signals 1024 from the backplane 1004. Typically, each analog signal 1024 arrives at the transceiver 1022 through a different signal path across the backplane 1004 and is thus potentially subject to different inter-symbol distortion. In accordance with the invention, each receiver 100 independently adapts to a respective signal path.

Figure 14A:
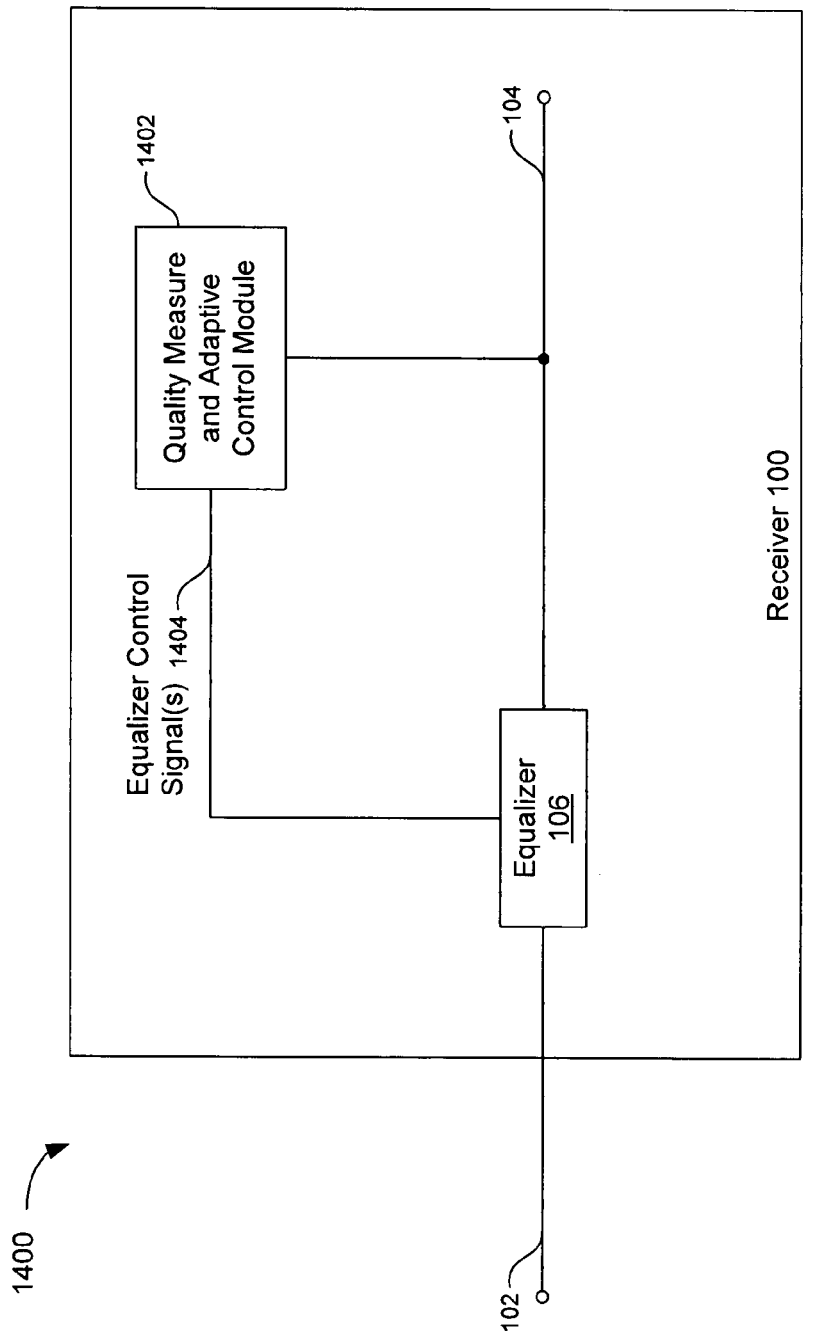
FIG. 14A is a block diagram of an example implementation of the receiver illustrated in FIG. 1.

FIG. 14A is an example receiver 1400 implementation of the receiver 100, further including a quality measuring and adaptive control module 1402, which receives the equalized analog data signal 104. The quality measuring and adaptive control module 1402 measures a quality of eye opening of the equalized analog data signal 104 and outputs one or more equalizer control signals 1404. The equalizer control signals 1404 control one or more parameters in the equalizer 106 to adaptively minimize distortions in the analog data signal 102.

Figure 14B:
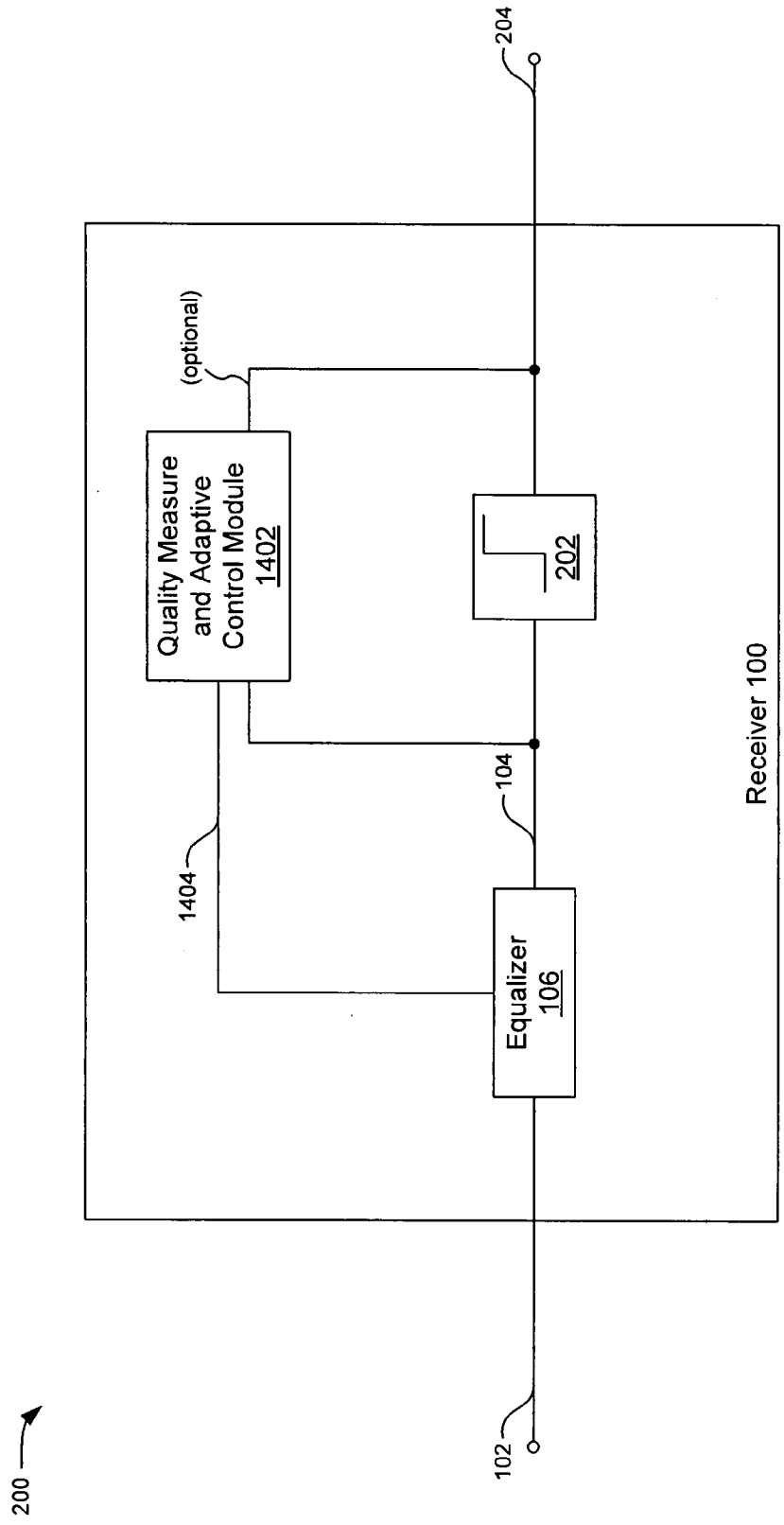
FIG. 14B is a block diagram of an example implementation of the receiver illustrated in FIG. 2.

FIG. 14B is an example implementation of the receiver 200, including the optional quantizer 202, the quality measuring and adaptive control module 1402, and an optional digital feedback, illustrated here as the one or more digital signals 204, also referred to herein as hard decisions 204. The hard decision 204 provides the quality measuring and adaptive control module 1402 with additional information from which to measure and/or control the eye opening.

The quality measuring and adaptive control module 1402 can be implemented with analog and/or digital circuits and can be implemented to output analog and/or digital equalizer control signals 1404. Example implementations of the quality measuring and adaptive control module 1402 are described below.

VI. Example Equalizer Embodiments

Figure 14C:
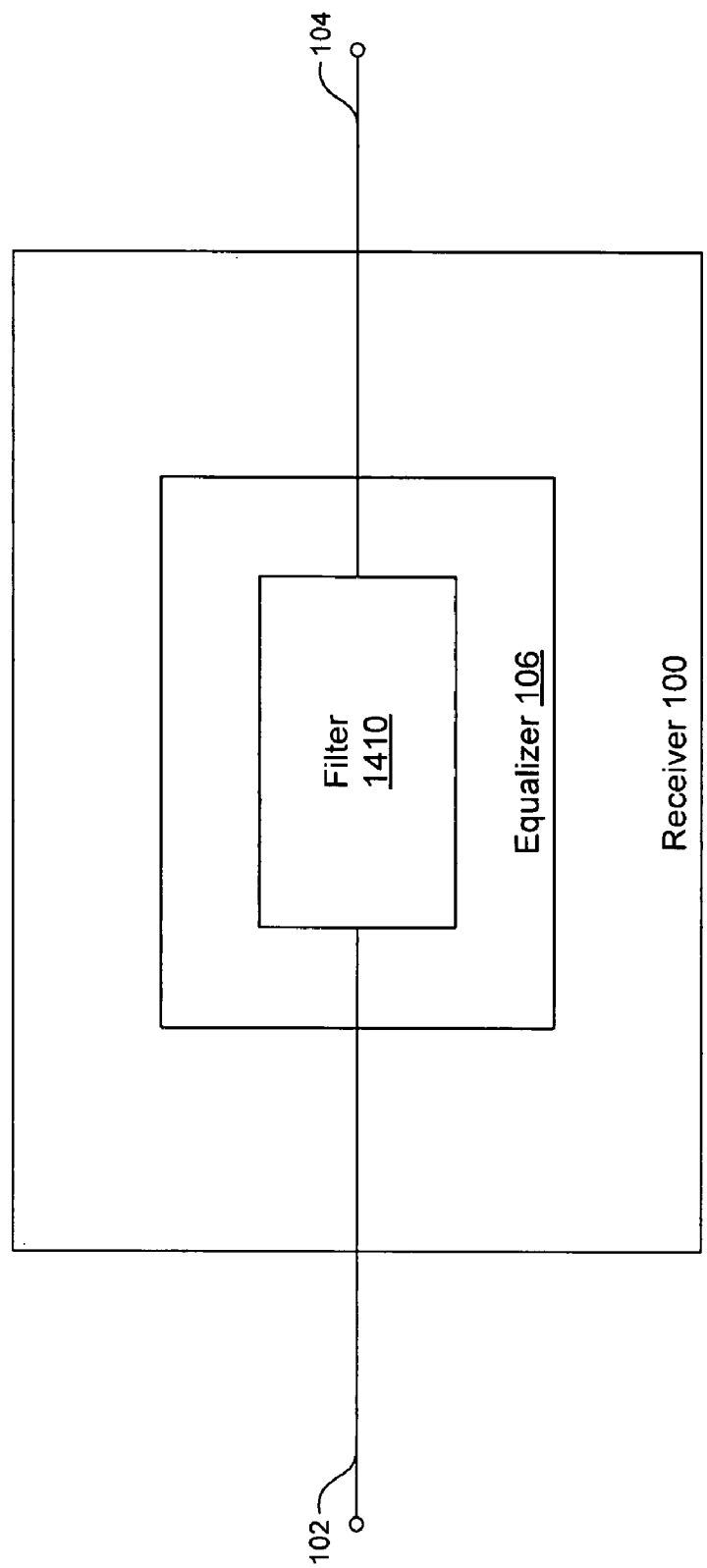
FIG. 14C is a block diagram of an example implementation of the receiver illustrated in FIG. 1.

FIG. 14C is an example embodiment of the receiver 100, wherein the equalizer 106 includes a filter 1410. In an embodiment, the filter 1410 is a high data rate filter.

Generally, high data rate filters are expensive to implement. However, the present invention provides filtering methods and systems, including adaptive hybrid analog/digital high frequency filtering methods and systems, that are uncomplicated and inexpensive to implement.

Figure 14D:
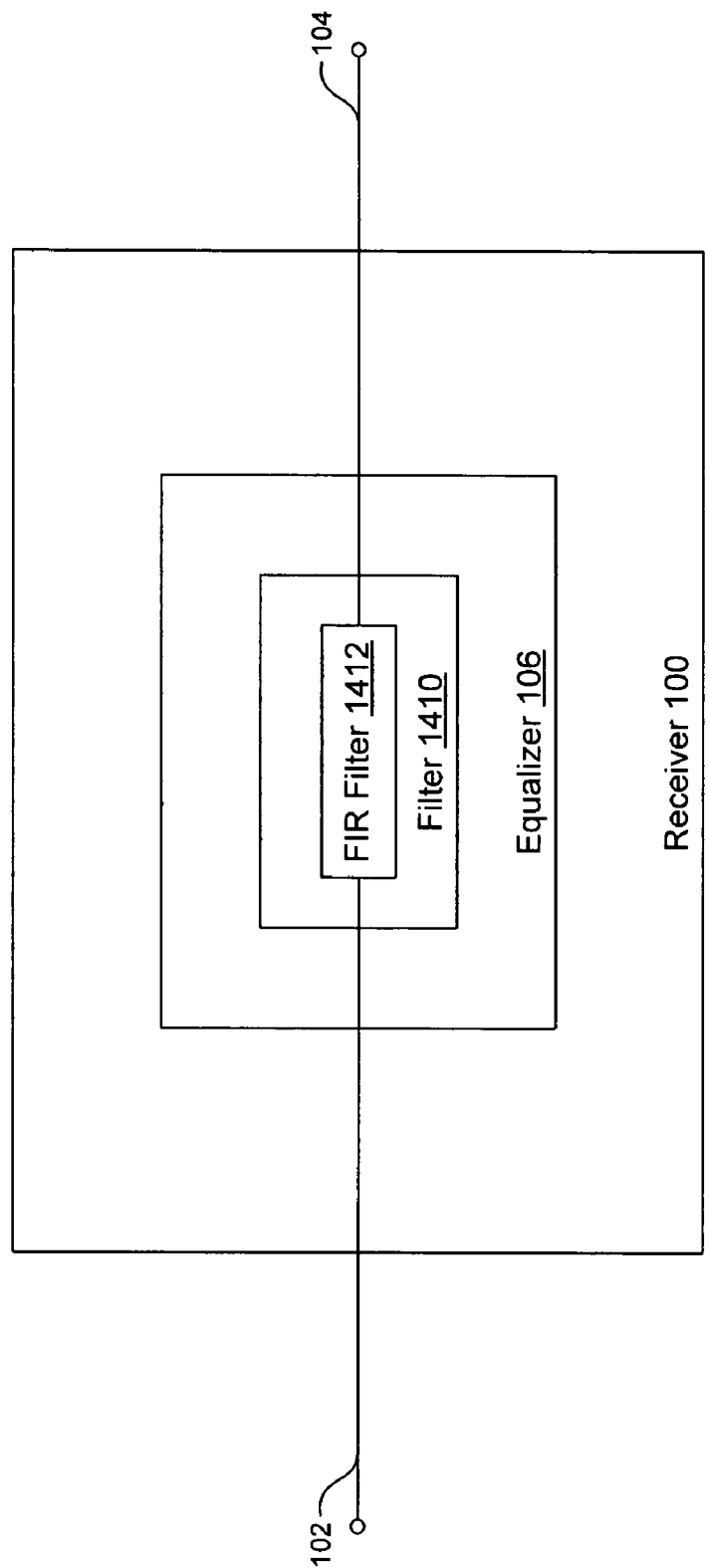
FIG. 14D is a block diagram of an example implementation of the receiver illustrated in FIG. 1.

For example, FIG. 14D is an example embodiment of the receiver 100, wherein the filter 1410 includes one or more finite impulse response ("FIR") filters 1412.

Figure 14E:
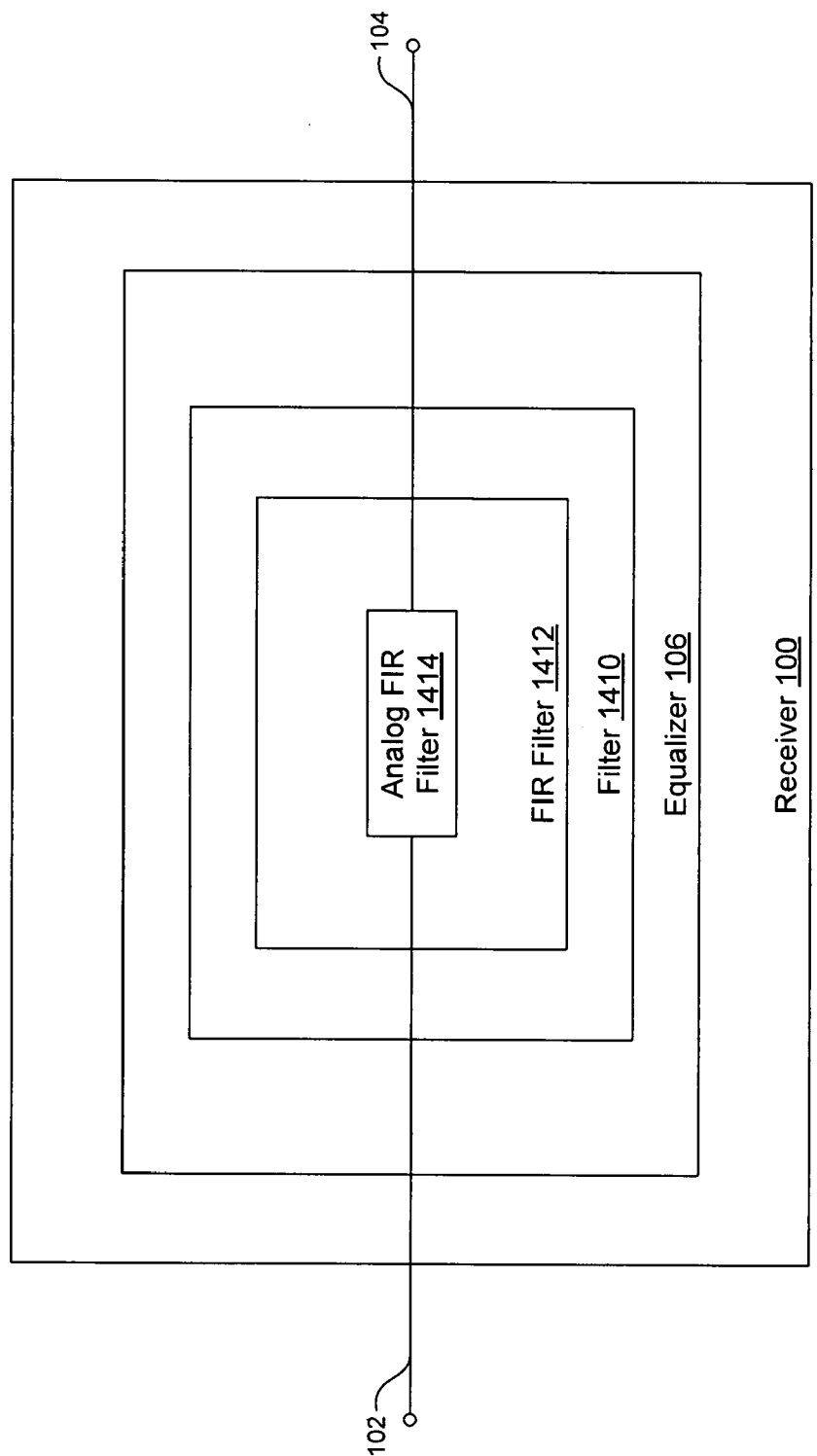
FIG. 14E is a block diagram of an example implementation of the receiver illustrated in FIG. 1.
Figure 14F:
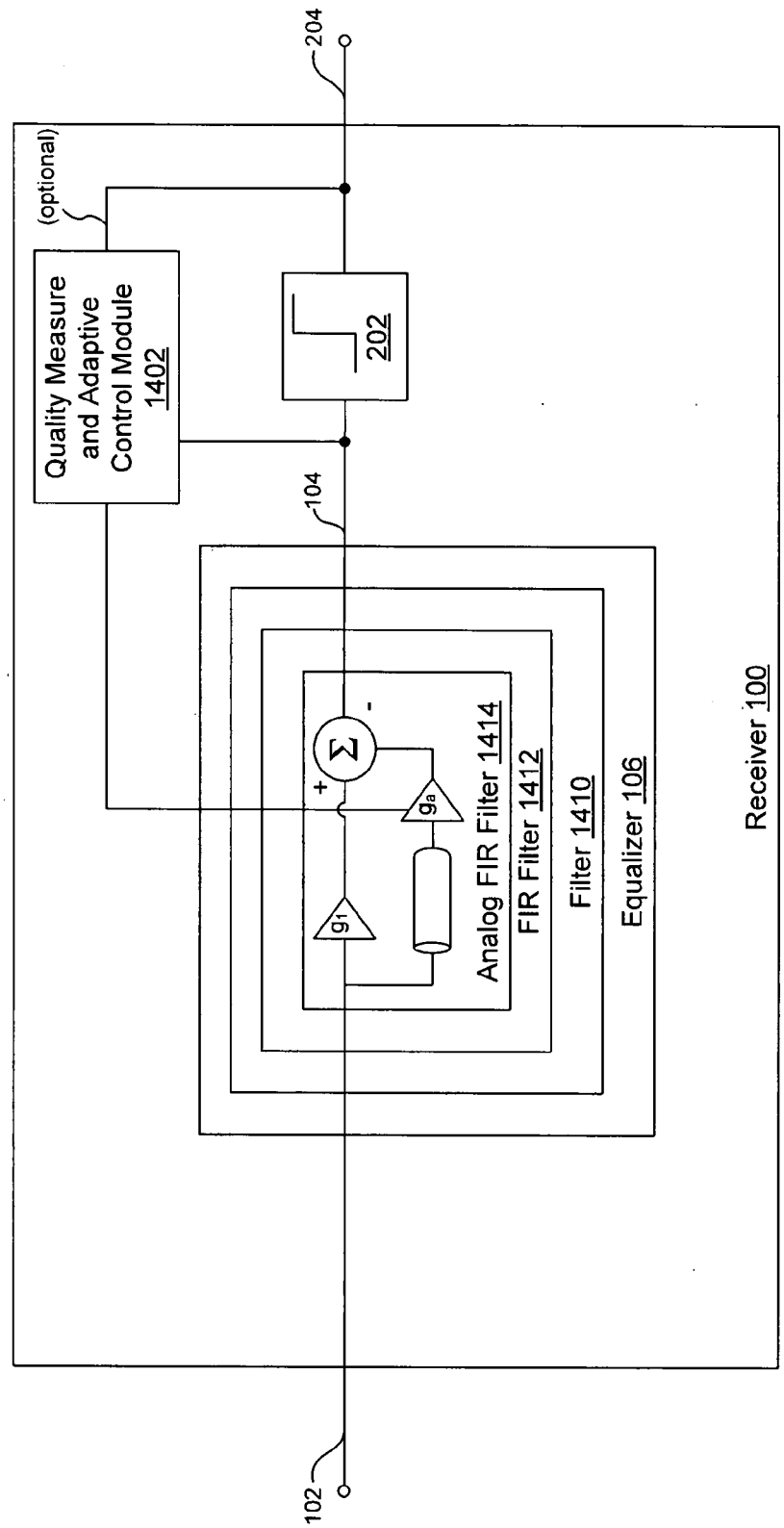
FIG. 14F illustrates example implementations of an analog finite impulse response filter illustrated in FIG. 14E.
Figure 14G:
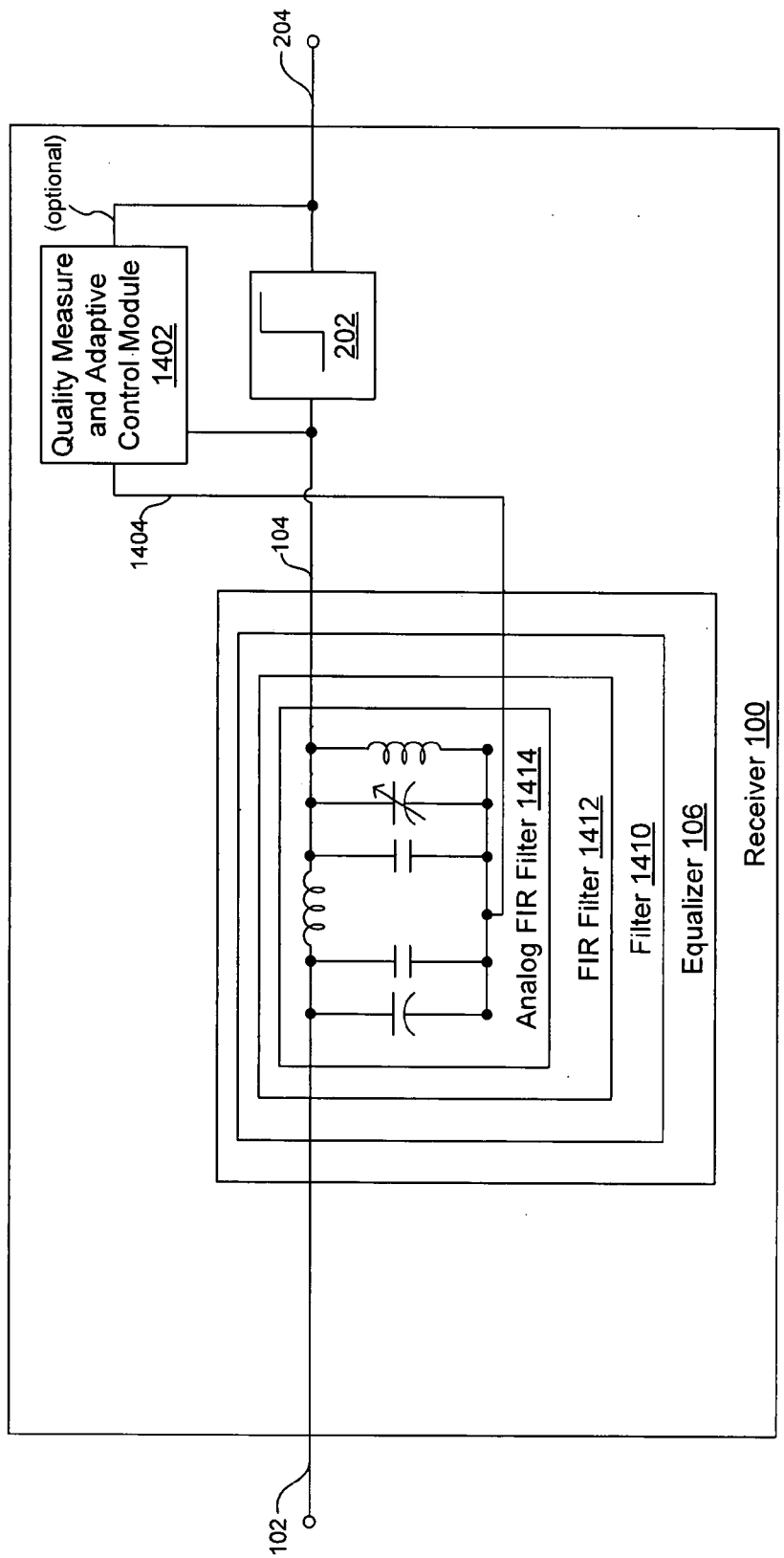
FIG. 14G illustrates example implementations of an analog finite impulse response filter illustrated in FIG. 14E.

In an embodiment, the one or more FIR filters 1412 are implemented as analog FIR filters. For example, FIG. 14E is an example implementation of the receiver 100 wherein the FIR filter 1412 includes one or more analog FIR filters 1414. FIGS. 14F and 14G illustrate example implementations of the one or more analog FIR filters 1414.

V. Discreet-Time Analog Equalization

In an embodiment, the present invention equalizes discreet-time analog samples of the analog data signal 102.

Figure 14H:
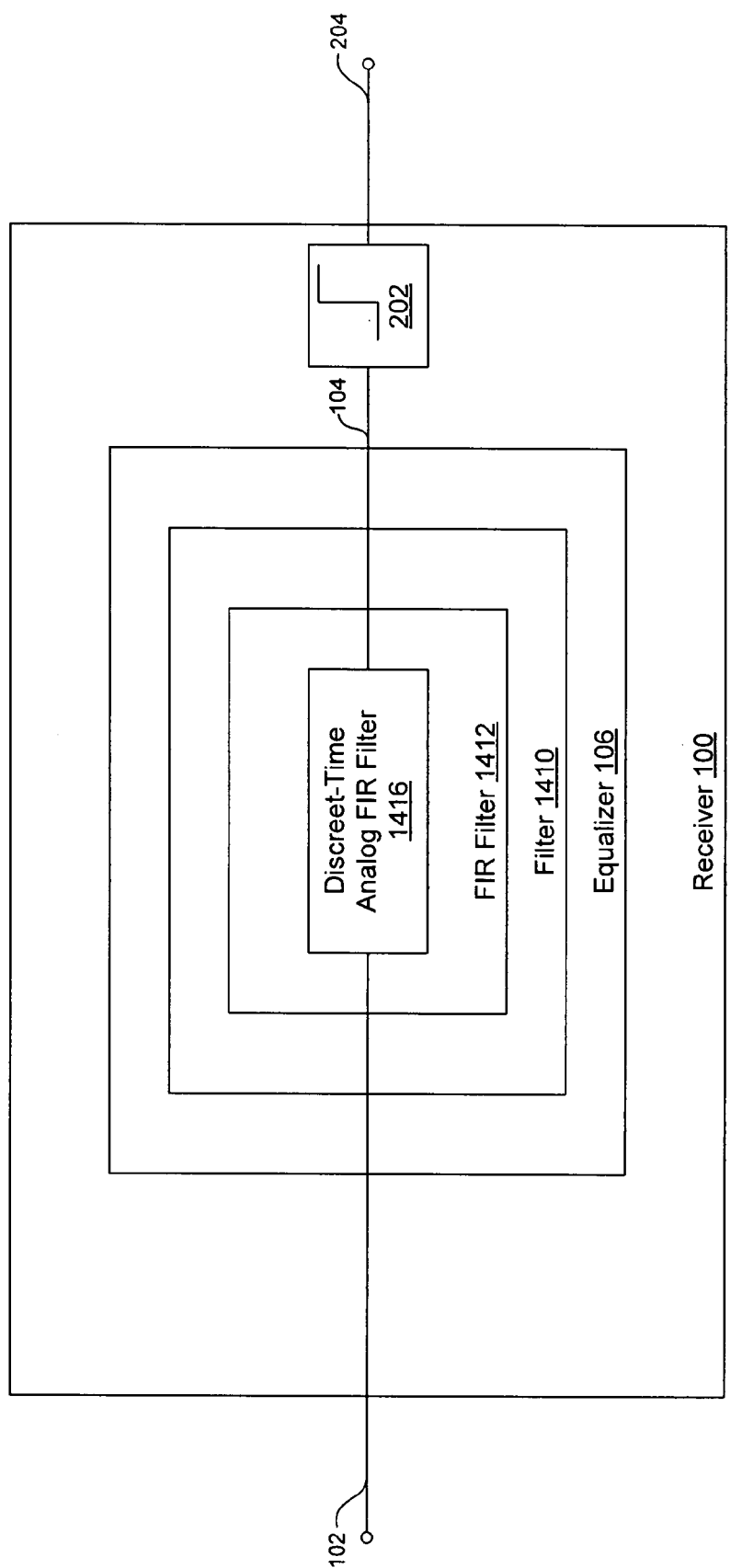
FIG. 14H is a block diagram of an example implementation of the receiver illustrated in FIG. 1.

Referring to FIG. 14H, the one or more FIR filters 1412 are implemented as one or more discreet-time analog FIR filters 1416.

Figure 15:
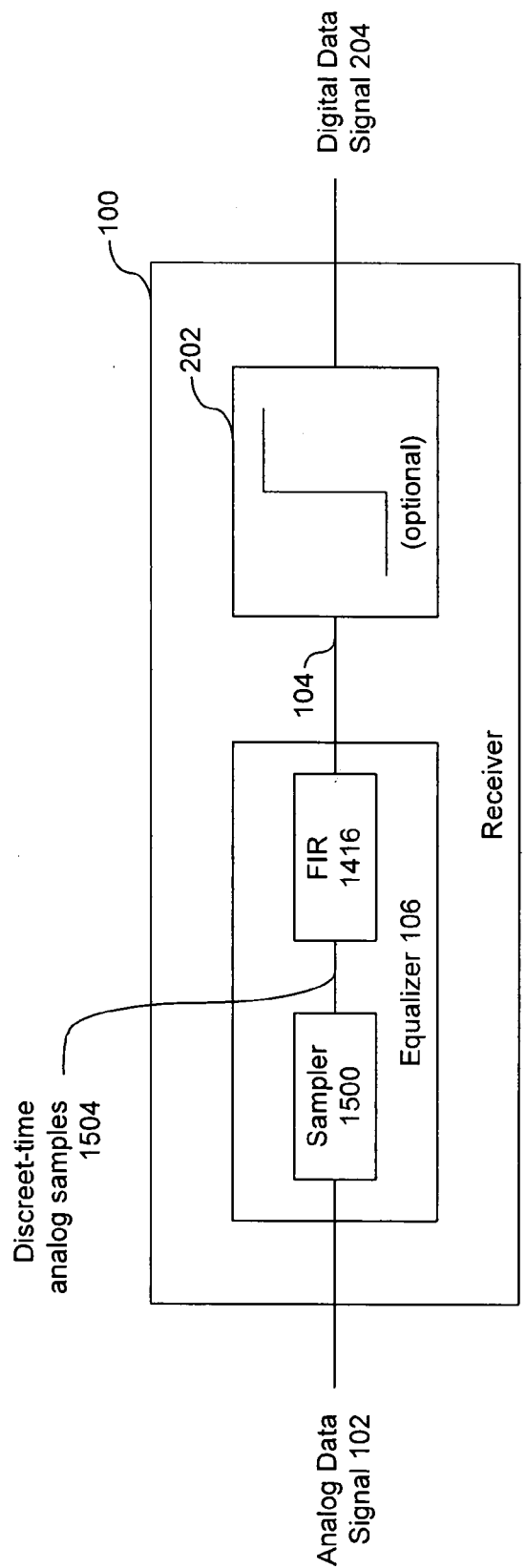
FIG. 15 is a block diagram of an example discreet-time analog implementation of the present invention.

Referring to FIG. 15, the equalizer 106 is illustrated with a sampler 1500 that samples the analog data signal 102 and outputs discreet-time analog samples 1504. In an embodiment, the sampler 1500 includes one or more sample and hold and/or a track and hold circuits. In FIG. 15, the sampler 1500 is illustrated as part of the equalizer 106. Alternatively, the sampler 1500 can be outside of the equalizer 106.

In operation, the sampler 1500 samples the analog data signal 102 in accordance with the Nyquist theorem and the discreet-time analog FIR filter 1416 operates on discreet-time analog samples 1504 of the analog data signal 102.

When the receiver 100 is implemented with one or more discreet-time filters 1416 and the optional quantizer 202, the quantizer 202 generally has better sensitivity because the discreet-time analog samples can be quantized over a longer period of time. Thus even a very low voltages can be detected by quantizer.

Figure 19:
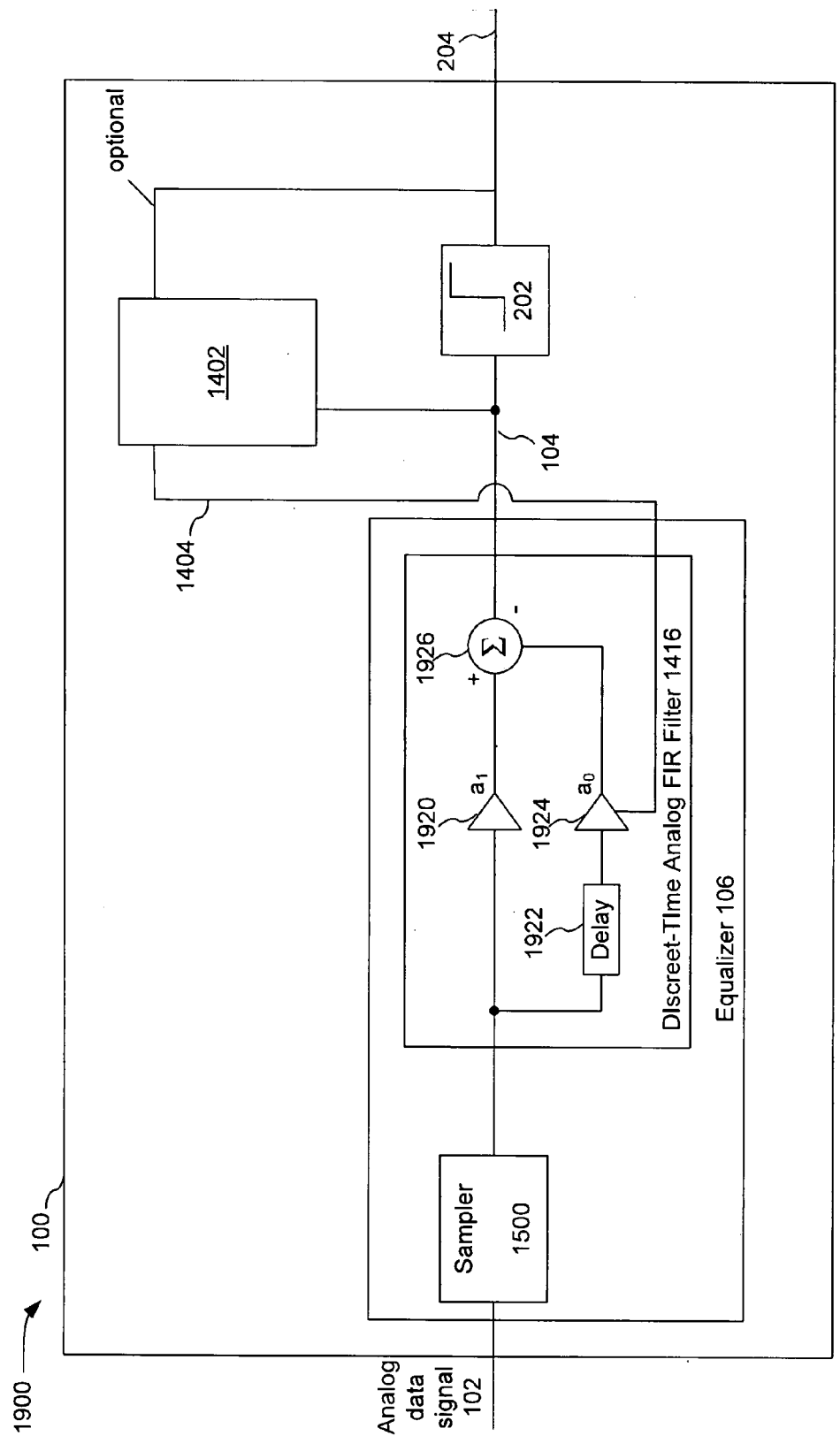
FIG. 19 is a block diagram of an example single-tap discreet-time analog implementation of the present invention.

The discreet-time analog FIR filter 1416 can be implemented in any of a variety of ways. FIG. 19 is a block diagram of an example single tap implementation of the discreet-time analog FIR filter 1416. Additional taps can also be implemented.

In FIG. 19, the discreet-time analog FIR filter 1416 includes a fixed weight 1920 that operates on a present output of the sampler 1500. The discreet-time analog FIR filter 1416 further includes a tap defined by a delay 1922 and an variable weight 1924. The variable weight 1924 operates on a prior output of the sampler 1500. The fixed weight 1920 and the variable weight 1924 scale the present output of the sampler and the prior output of the sampler, respectively, according to values of the respective weights.

The output of the variable weight 1924 is subtracted from the output of the fixed weight 1920 in a combiner 1926.

Figure 16:
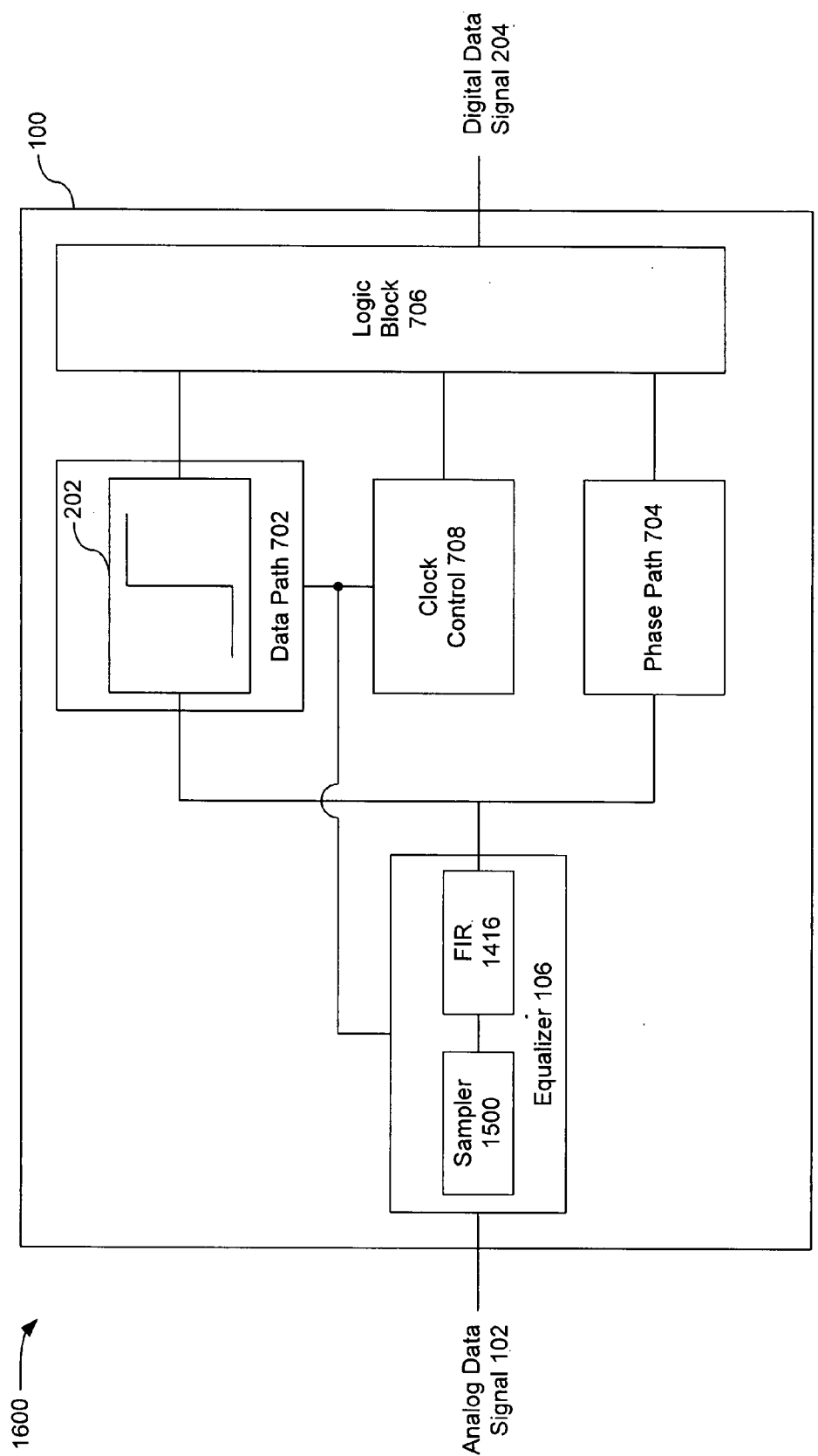
FIG. 16 is a block diagram of an example discreet-time analog dual path implementation of the present invention.

FIG. 16 is an example discreet-time analog dual path receiver 1600 implementation of the receiver 100, including the sampler 1500, the discreet-time analog FIR filter 1416, and optional quantizer 202.

In FIG. 16, the phase path 704 provides clock recovery for the sampler 1500 and the data path 702 so that the sampler 1500 and the quantizer 202 operate at the correct frequency and phase of the analog data signal 102.

Figure 17:
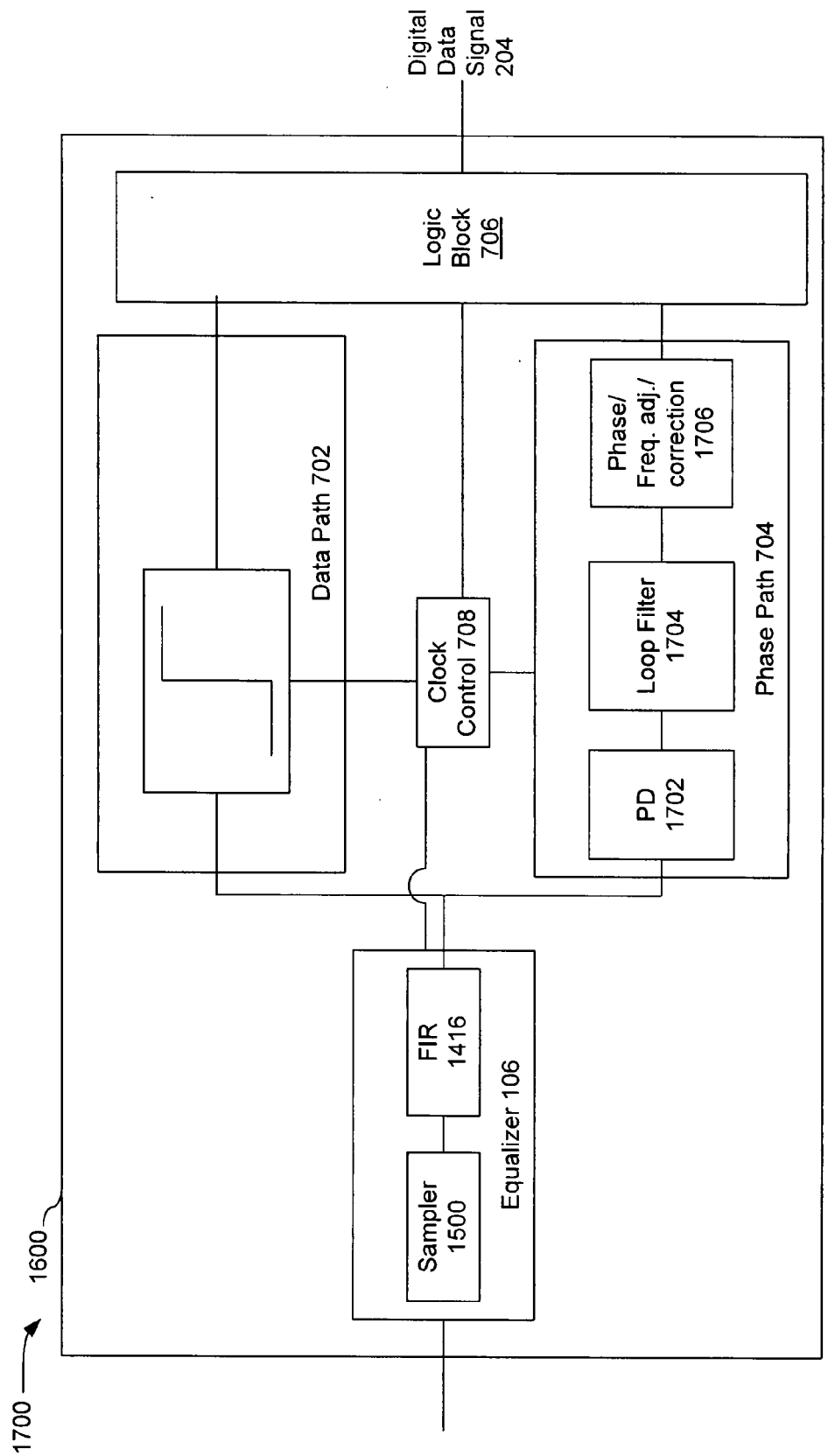
FIG. 17 is a block diagram of an example implementation of the receiver illustrated in FIG. 16.

FIG. 17 is an example discreet-time analog dual path receiver 1700 implementation of the receiver 1600, wherein the phase path 704 includes a phase detector 1702, a loop filter 1704, and a phase/frequency adjust/correct block 1706.

Phase path 704 preferably takes into account any path delay in the data path 702. One way to take into account delay in data path 702 is to determine the path delay in the data path 702 and design the phase path 704 accordingly.

Alternatively, the data path 702 and the phase path 704 are made substantially similar to one another so that they have substantially similar path delays. In such an embodiment, phase and frequency correction developed by the phase path 704 inherently corrects for any path delay in the data path 702.

Figure 18:
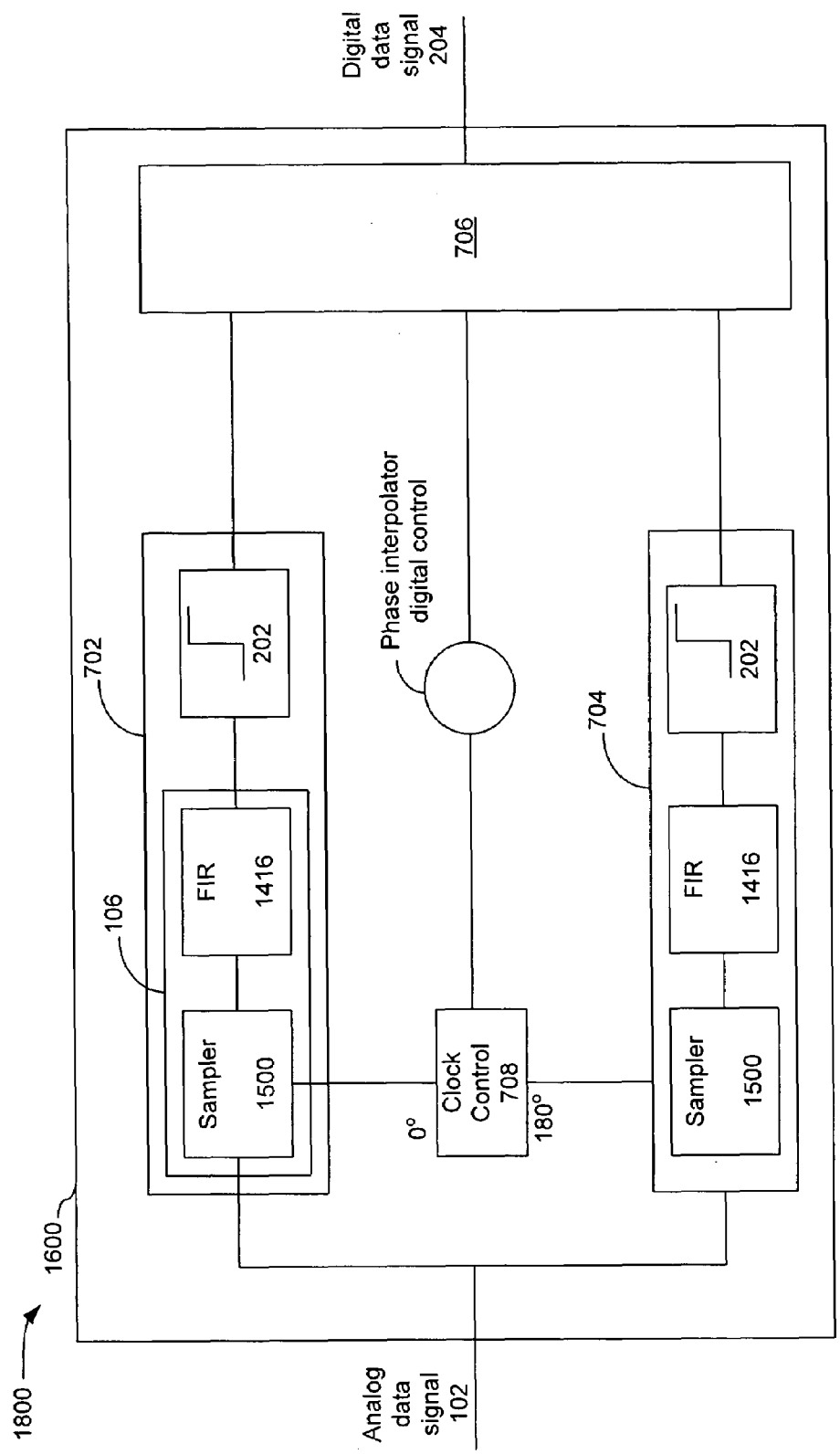
FIG. 18 is a block diagram of an example implementation of the receiver illustrated in FIG. 16.

For example, FIG. 18 is an example dual path receiver 1800 implementation of the receiver 1600, wherein the equalizer 106 forms part of the data path 702 and the phase path 704 so that at least the front end of data path 702 and the front end of phase path 704 are substantially similar to one another.

Figure 20:
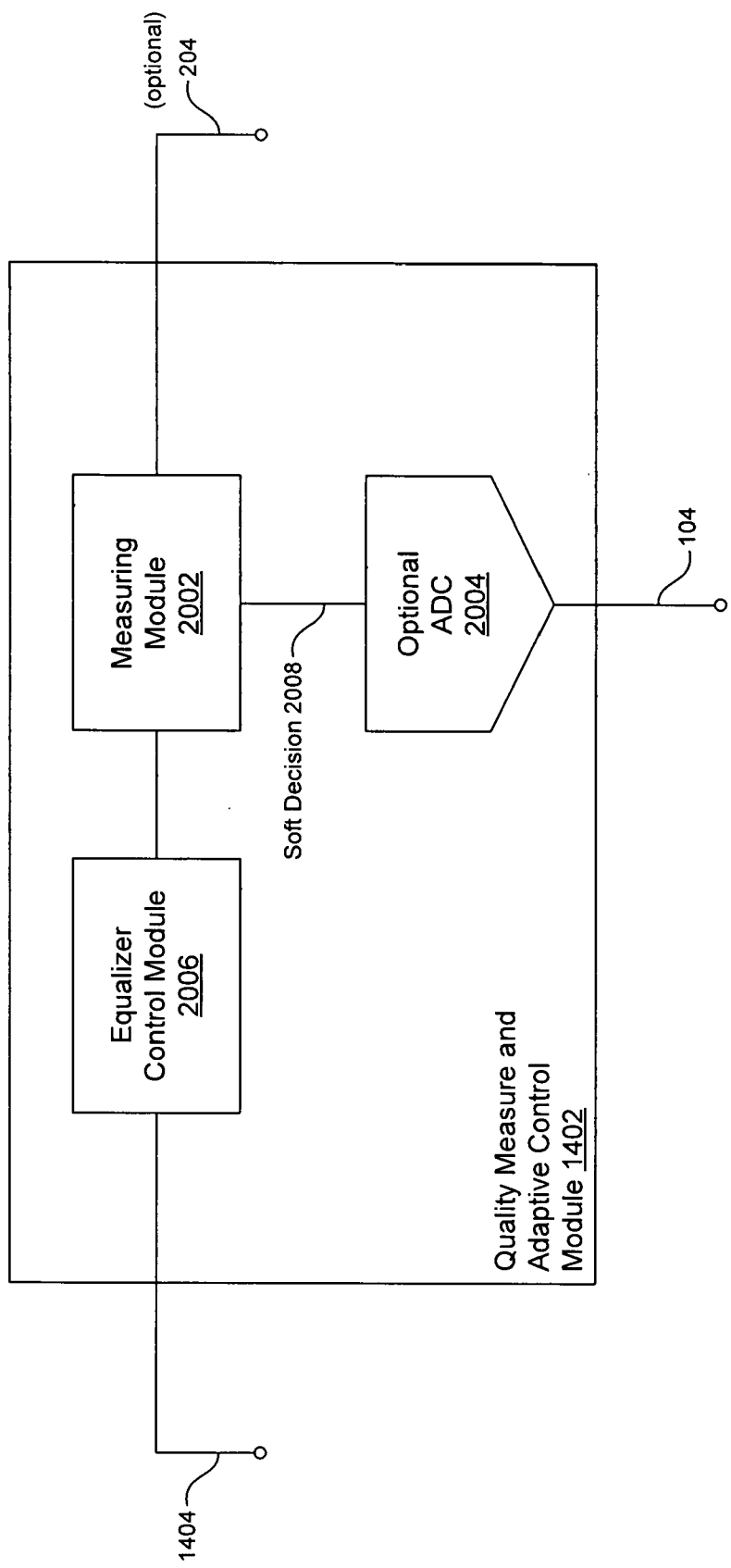
FIG. 20 is a block diagram of an example implementation of a quality measuring and adaptive control module in accordance with an aspect of the present invention.

VI. Example Implementations of the Quality Measuring and Adaptive Control Module FIG. 20 is a high level block diagram of an example implementation of the quality measuring and adaptive control module 1402 (FIG. 14A, 14F and 14G), including a measuring module 2002 and an equalizer control module 2006. Measuring module 2002 is implemented with analog and/or digital circuitry. Similarly, equalizer control module 2006 is implemented with analog and/or digital circuitry.

Where the measuring module 2002 is implemented with digital circuitry, an optional analog-to-digital converter ("ADC") 2004 converts the equalized analog data signal 104 to a multi-level digital representation 2008 of the equalized analog data signal 104, for use by the measuring module 2002. The multi-level digital representation 2008 is also referred to herein as a soft decision 2008.

Alternatively, digital conversion can be performed within the measuring module 2002, between the measuring module 2002 and the equalizer control module 2006, or within the equalizer control module 2006. Alternatively, where the quality measuring and adaptive control module 1402 is implemented entirely with analog components, the optional ADC 2004 is omitted.

In a discreet-time analog embodiment, the optional ADC 2004 can be operated at a sub-sample rate with respect to the sampler 1500. In other words, the ADC 2004 operates on fewer than every equalized sample from the discreet-time analog FIR filter 1416. For example, in an embodiment, the ADC 2004 operates on every eighth equalized sample from the discreet-time analog FIR filter 1416.

Alternatively, in order to avoid lock-up on certain data patters, the ADC 2004 sub-sample rate is periodically changed to one or more other sub-sample rates. For example, the ADC 2004 can be operated at a first sub-sample rate (e.g. 1/8) for a period of time and then operated at a second sub-sample rate (e.g. 1/7) for another period of time. Following that, operation of the ADC 2004 can revert back to the first sub-sample rate or can be changed to a third sub-sample rate. Any number of different sub-sample rates and/or periods can be utilized. Changes to the sub-sample rate and/or the periods that the sub-sample rates are utilized can be the same or different. Changes to the sub-sample rates and/or periods can be random or ordered.

The invention is not, however, limited to these example embodiments. Based on the description herein, one skilled in the relevant art(s) will understand the ADC 2004 can operate on every equalized sample from the FIR filter 1416, or any subset and/or off-set thereof.

In an embodiment, the quality measuring and adaptive control module 1402 can be implemented to output one or more analog and/or digital equalizer control signals 1404. Where the quality measuring and adaptive control module 1402 is implemented to output one or more digital equalizer control signals 1404, the invention essentially provides digitally controlled equalization of an analog data signal.

Where the quality measuring and adaptive control module 1402 is implemented to output one or more digital equalizer control signals 1404, and the equalizer includes a discreet-time analog FIR filter 1416 (FIGS. 14H and 15), the invention essentially provides digitally controlled equalization of a discreet-time analog data signal.

In an embodiment, the receiver 100 includes the optional quantizer 202, the quality measuring and adaptive control module 1402 optionally receives the digital data signal 204, and the quality measuring and adaptive control module 1402 compares the equalized analog data signal 104 with the digitized data signal 204. In an example implementation of such an embodiment, the measuring and adaptive control module 1402 utilizes a least-means-squared ("LMS") algorithm to adaptively control the equalizer 106. For example, the LMS algorithm can provide tap updates for the FIR filter 1412 (FIGS. 14D-H). Any of a variety of conventional LMS methods and/or systems can be utilized.

Where the quality measure and adaptive control module 1402 receives the equalized analog data signal 104 and the hard decision 204, the quality measure and adaptive control module 1402 optionally converts the equalized analog data signal 104 to the soft decision 2008 to compare it with the hard decision 204, utilizing, for example, the LMS algorithm.

Alternatively, the quality measuring and adaptive control module 1402 compares the equalized analog data signal 104 to the hard decision 204 without converting the equalized analog data signal 104 to a digital soft decision.

The present invention is not limited to LMS embodiments.

In an embodiment, the quality measuring and adaptive control module 1402 generates equalizer control signals 1404 without utilizing feedback from the quantizer 202.

Figure 21A:
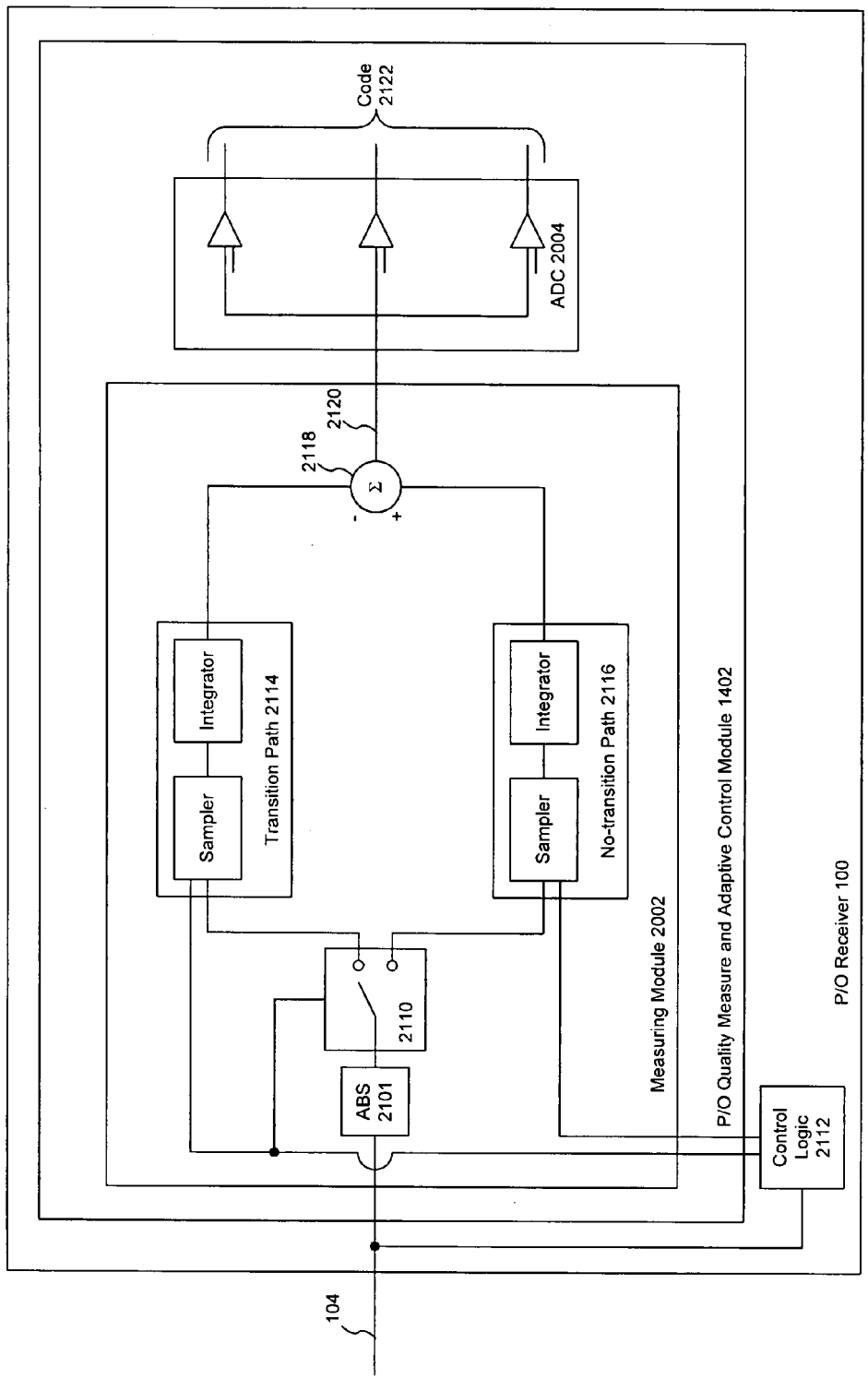
FIG. 21A is a block diagram of an example implementation of a portion of the quality measuring and adaptive control module illustrated in FIG. 20.
Figure 21B:
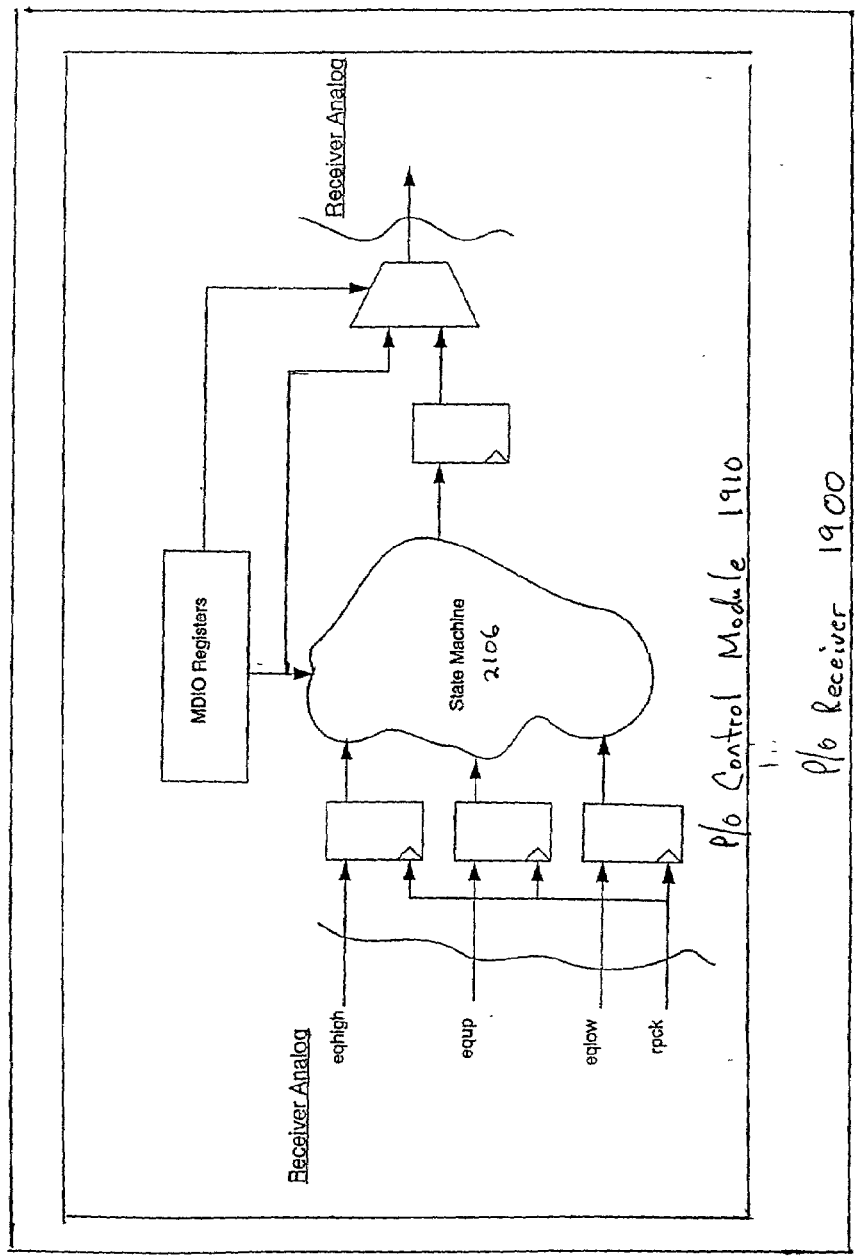
FIG. 21B is a block diagram of an example implementation of a portion of the quality measuring and adaptive control module illustrated in FIG. 20.
Figure 21C:
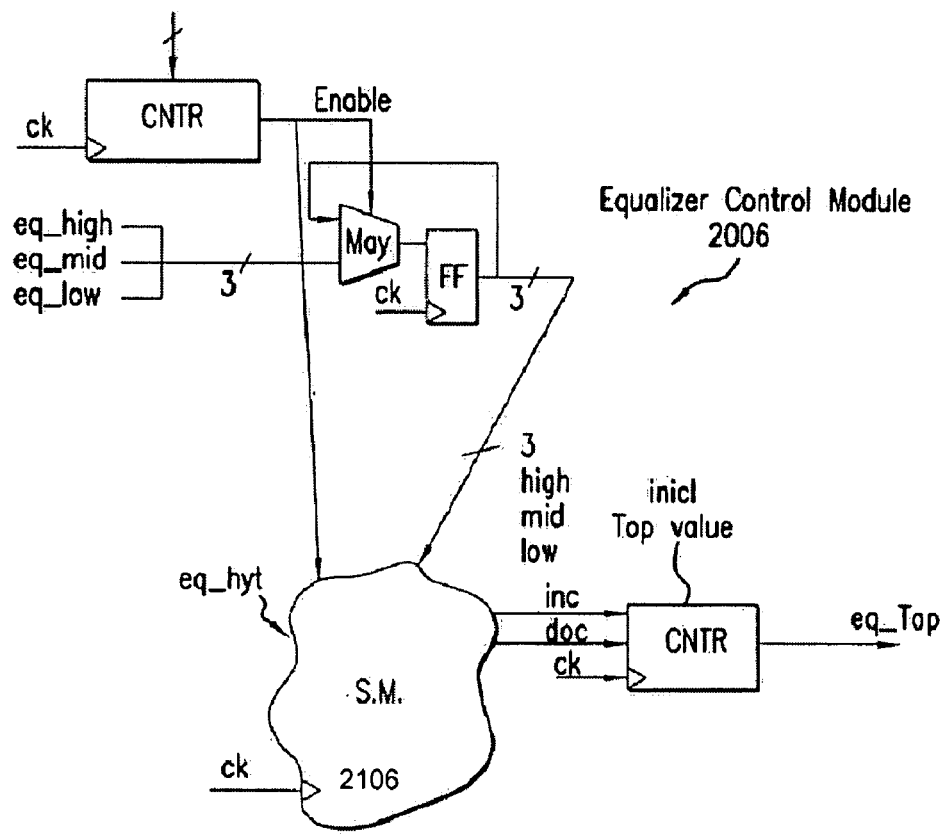
FIG. 21C is a block diagram of an example implementation of a portion of the quality measuring and adaptive control module illustrated in FIG. 20.
Figure 21D:
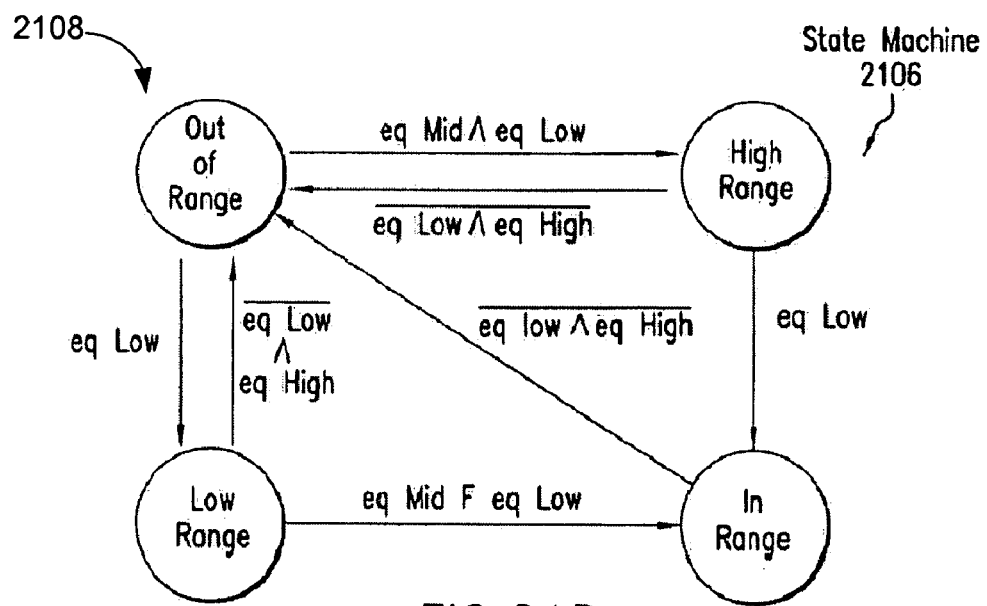
FIG. 21D is an example state diagram for a state machine illustrated in FIGS. 21B and 21C.

FIGS. 21A, B, C and D illustrate an example implementation of the receiver 100. FIG. 21A illustrates example implementations of the difference detector 2102 and the ADC 2104. FIG. 21B and 21C illustrate example implementations of the equalizer control module 2006. FIG. 21D is an example state diagram 2108 for implementing a state machine 2106 illustrated in FIGS. 21B and 21C. Operation of these example embodiments are now described.

Referring to FIG. 21A, the difference detector 2102 receives the equalized analog data signal 1906. An amplitude module 2101 measures an amplitude of the equalized analog data signal 19064. In an embodiment, the amplitude module 2101 determines absolute amplitudes of the equalized analog data signal 1906.

A control logic module 2112 determines whether a portion of the equalized analog data signal 1906 is a steady state soft portion or a post-transition portion.

A switching system 2110 directs the amplitudes of the equalized analog data signal 1906 to a transition path 2114 or a no-transition path 2116, according to controls from the control logic module 2112. Tn an embodiment, the control logic module 2112 is part of the phase path 704.

Transition path 2114 and no-transition path 2116 sample and integrate the amplitudes of the equalized analog data signal 1906 to obtain average values of post-transition and steady state portions, respectively. A combiner 2118 outputs an average difference 2120 between post-transition and steady state values.

The average difference 2120 is provided to the ADC 2104, which outputs a digital representation 2122 of the average difference 2120. In an embodiment, the ADC 2104 is implemented as a high/med/low system that compares the average difference 2120 with a plurality of pre-determined values, whereby the ADC 2104 outputs a thermometer code that indicates which, if any, of the plurality of predetermined values are exceeded by the average difference 2120.

Referring to FIG. 21B, the digital representation 2122 is provided to the state machine 2106. In an embodiment, the state machine 2106 samples the digital representation 2122 at a pre-determined rate. The state machine 2106 determines whether a current equalization factor (e.g., variable weight 1924 in FIG. 19) is too high, too low, or adequate. Depending upon the determination, the state machine 2106 will increase, decrease or maintain the current equalization factor. Appropriate tap updates are provided by the state machine 2106 as equalizer control signals 1404.

The elements described above can be implemented in hardware, software, firmware, and combinations thereof. The elements described above can be implemented with analog and/or digital circuits. For example, integration can be performed digitally with accumulators.

In an embodiment, the invention utilizes transconductors, or current sources. For example, in an embodiment of the discreet-time analog system FIG. 19, the fixed weight 1920 and the variable weight 1924 are implemented with transconductors. Furthermore, the discreet-time analog FIR filter 1416 is implemented with differential signals, including "plus" and "minus" differential signals for example. The combiner 1926 is then implemented by coupling the plus output from the fixed weight 1920 with the minus output of the variable weight 1924 and by coupling the minus output from the fixed weight 1920 with the plus output of the variable weight 1924.

The example implementations of the discreet-time analog FIR filter 1416 described and illustrated herein are provided for illustrative purposes only. Based on the description herein, one skilled in the relevant art(s) will understand that the discreet-time analog FIR filter 1416 can be implemented in a variety of other ways. For example, and without limitation, additional taps can be utilized, fixed weight 1920 can be replaced with a variable weight, and/or variable weight 1924 can be replaced with a fixed weight. Where the discreet-time analog FIR filter 1416 is implemented with fixed weights only, the equalizer 106 is referred to herein as a fixed-weight equalizer.

VII. Multi-Path Adaptive Equalization

Figure 22:
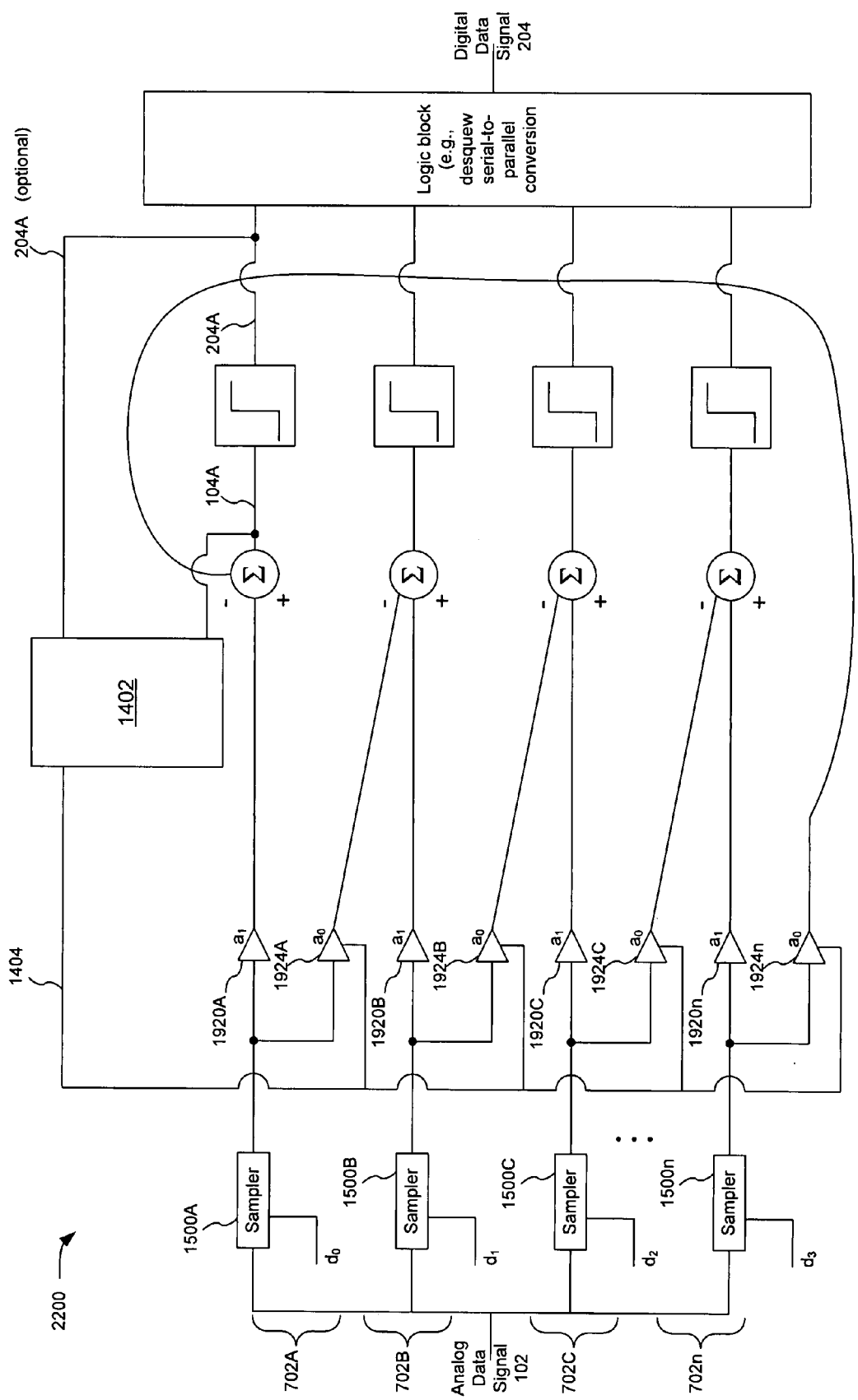
FIG. 22 is a block diagram of an example multi-path receiver, in accordance with an aspect of the present invention.

FIG. 22 is an example discreet-time analog multi-path receiver 2200 where the data paths 702A-n are operated in a time-staggered fashion, for example by the clock signals 304A-n (FIG. 9). The clock signals 304A-n operate the samplers 1500A-n in staggered fashion so that data path n-1 samples the analog data signal 102 prior to the data path n. In this embodiment, the delay elements 1922 (FIG. 19) are omitted and the input to the variable weights 1924A-n are provided by the sampler 1500 in an adjacent data path 702, which sampled at a prior time. For example, variable weight 1924B in data path 702B receives samples from sampler 1500A in data path 702A.

Multi-path embodiments can be implemented to control the discreet-time analog FIR filter 1416 based on the equalized analog data signal 104 and/or the digital data signal 204, as described above.

In a discreet-time analog multi-path receiver embodiment, one or more quality measure and adaptive control modules 1402 can be utilized. For example, in FIG. 22, a single quality measure and adaptive control module 1402 receives equalized analog data signal 104 and optionally receives digital data signal 204, from a single data path 702A. Alternatively, separate quality measure and adaptive control modules 1402 are implemented for each data path 702.

Where four data paths 702A-D are implemented, and where the quality measure and adaptive control module 1402 operates on every eighth sample of the equalized analog data signal 104A, as described above, the quality measure and adaptive control module 1402 effectively operates on every thirty-second sample of the analog data signal 102.

The invention is not, however, limited to these example embodiments. Based on the description herein, one skilled in the relevant art(s) will understand that other embodiments can be implemented. For example, any number of data paths 702 can be implemented. Also, the quality measure and adaptive control module 1402 can operate on every sample of the equalized analog data signal 104A, or any sub-set thereof. Similarly, the quality measure and adaptive control module 1402 can operate on samples from other data paths 702 B-n in addition to and/or alternative to the samples from data path 702A.

In an embodiment, the discreet-time analog multi-path receiver 2200 automatically switches between single data path operation and staggered multi-path operation depending upon the data rate, without user input.

In an embodiment, the discreet-time analog multi-path receiver 2200 utilizes transconductances, or current sources, as described above.

VII. Implementation in the Example Environments

One or more receivers in accordance with the invention can be implemented in any of the example environments illustrated in FIGS. 1-10. However, the invention is not limited to the example environments.

Referring to FIG. 10, for example, one or more receivers 100, implemented in accordance with the invention, can be implemented as part of the router 1000. For example, in an embodiment, transceiver 1022 includes a plurality of receivers 100, implemented in accordance with the present invention, wherein each receiver 100 receives a different one of the analog data signals 1024 from the backplane 1004. Each receiver 100 adapts to the signal path associated with its respective analog data signal 1024, in accordance with the invention.

In an embodiment, one or more transceivers 1010 and/or 1022 in accordance with the present invention are implemented on an application specific integrated circuit ("ASIC") that includes the switch fabric 1018.

In an embodiment, one or more receivers according to the present invention are implemented on an integrated circuit ("IC") chip.

In an embodiment, one or more multi-path receivers according to the present invention are implemented on an integrated circuit ("IC") chip.

Figure 23:
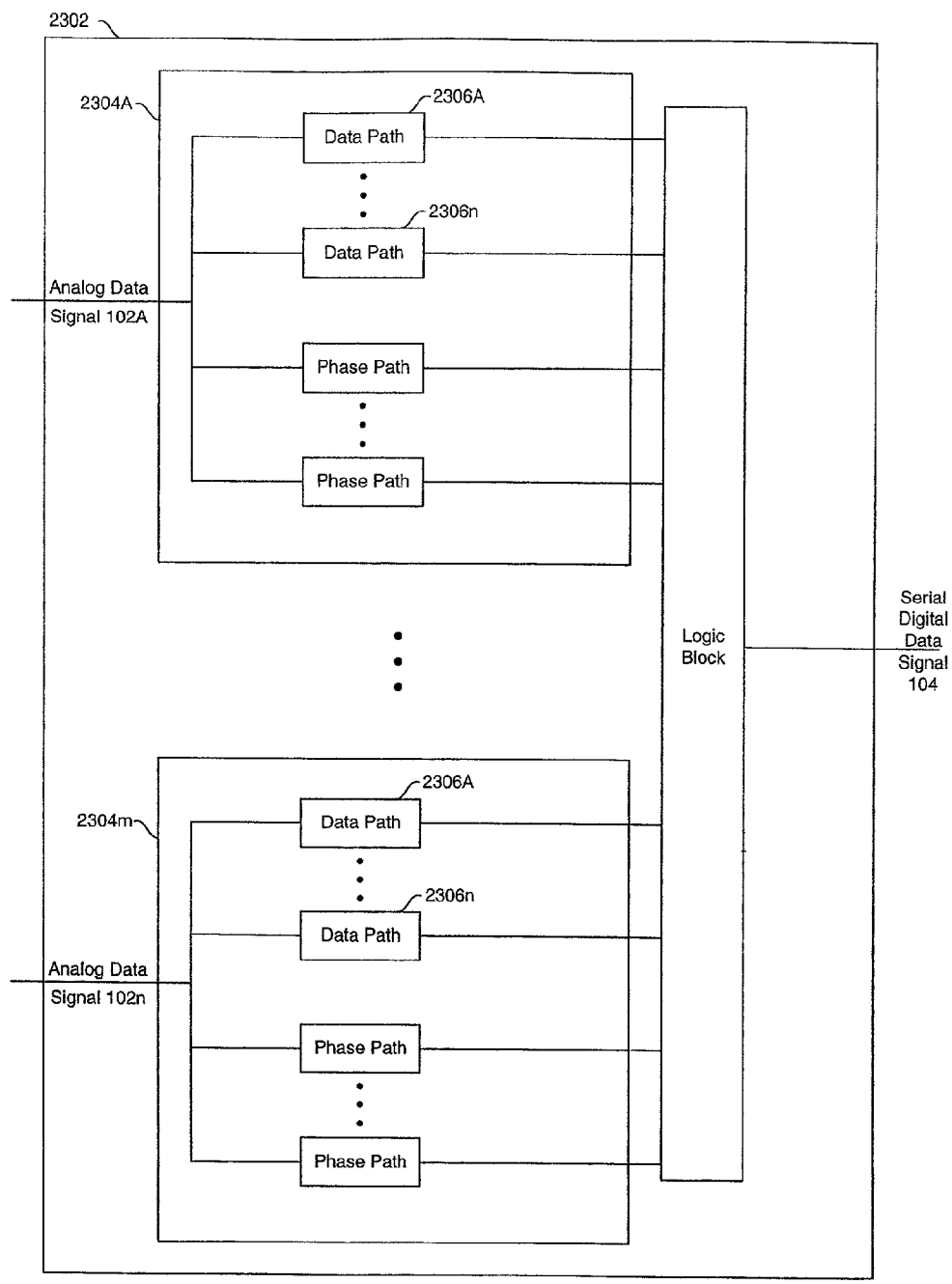
FIG. 23 is a block diagram of an example discreet-time analog multi-channel, multi-path receiver in accordance with an aspect of the present invention.

For example, FIG. 23 is an example IC chip 2302 including a plurality of multi-path receivers 2304A-m, each multi-path receiver 2304A-m having multiple data paths 2306A-n. "n" and "m" can be equal or different. In an embodiment, "n" and "m" equal four. The multi-path receivers 2304A-m can have different numbers of data paths 2306.

The IC chip 2302 can be implemented as one or more of the receivers 100 in the router 1000 illustrated in FIG. 10. For example, in an embodiment, the IC chip 2300 includes transceiver 1022 in FIG. 10, wherein each receiver 2304 receives a different one of the analog data signals 1024 from the backplane 1004. Each of the analog data signals 1024 travels through the backplane 1004 through a different path and thus potentially have different inter-symbol distortions. Accordingly, each of the receivers 2304 will adapt to the signal path associated with its respective analog data signal 1024.

In an embodiment, IC chip 2302 further the switch fabric 1018.

IX. Example Methods for Adaptive Equalization

Figure 24:
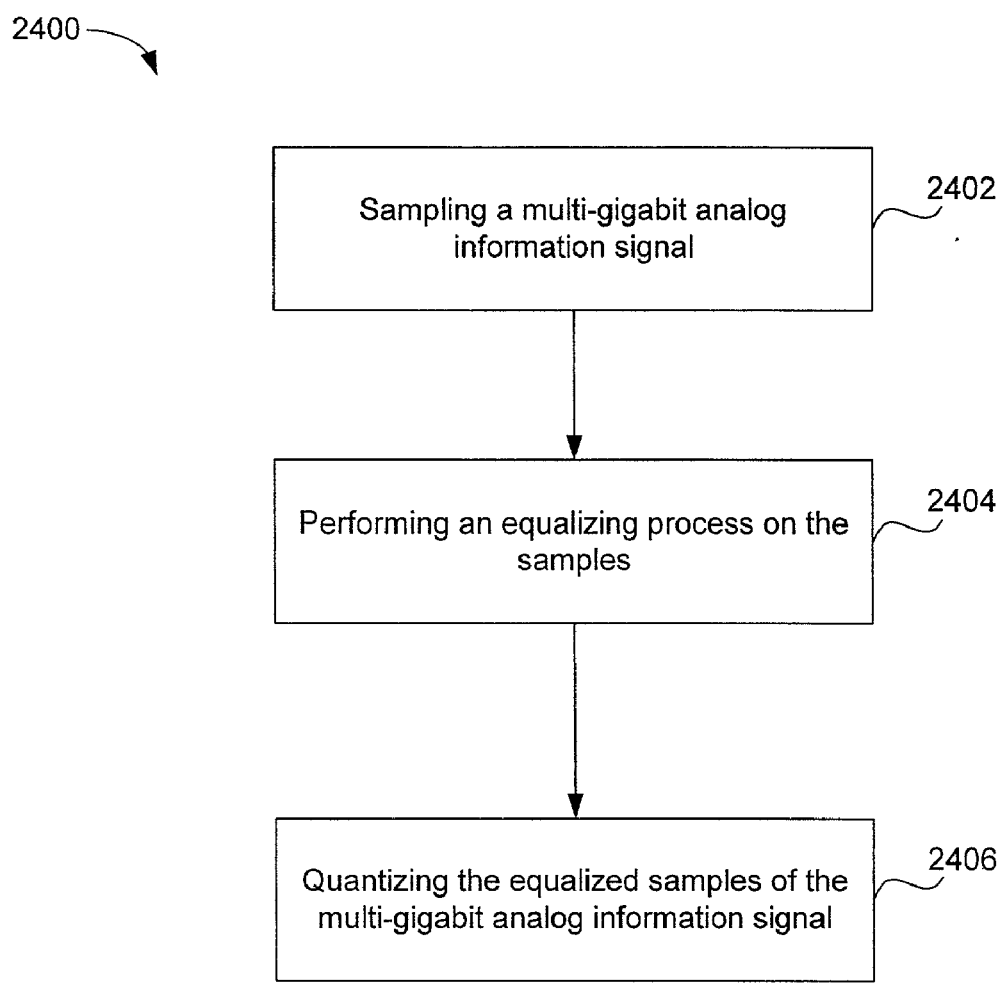
FIG. 24 is an example process flowchart for adaptively equalizing an analog information signal for a given signal path, in accordance with an aspect of the present invention.

FIG. 24 is an example process flowchart 2400 for adaptively equalizing an analog information signal for a given signal path. In an embodiment, the analog information signal is a higher data rate analog information signal. Alternatively, the analog information signal is a lower data rate analog information signal.

Figure 25:
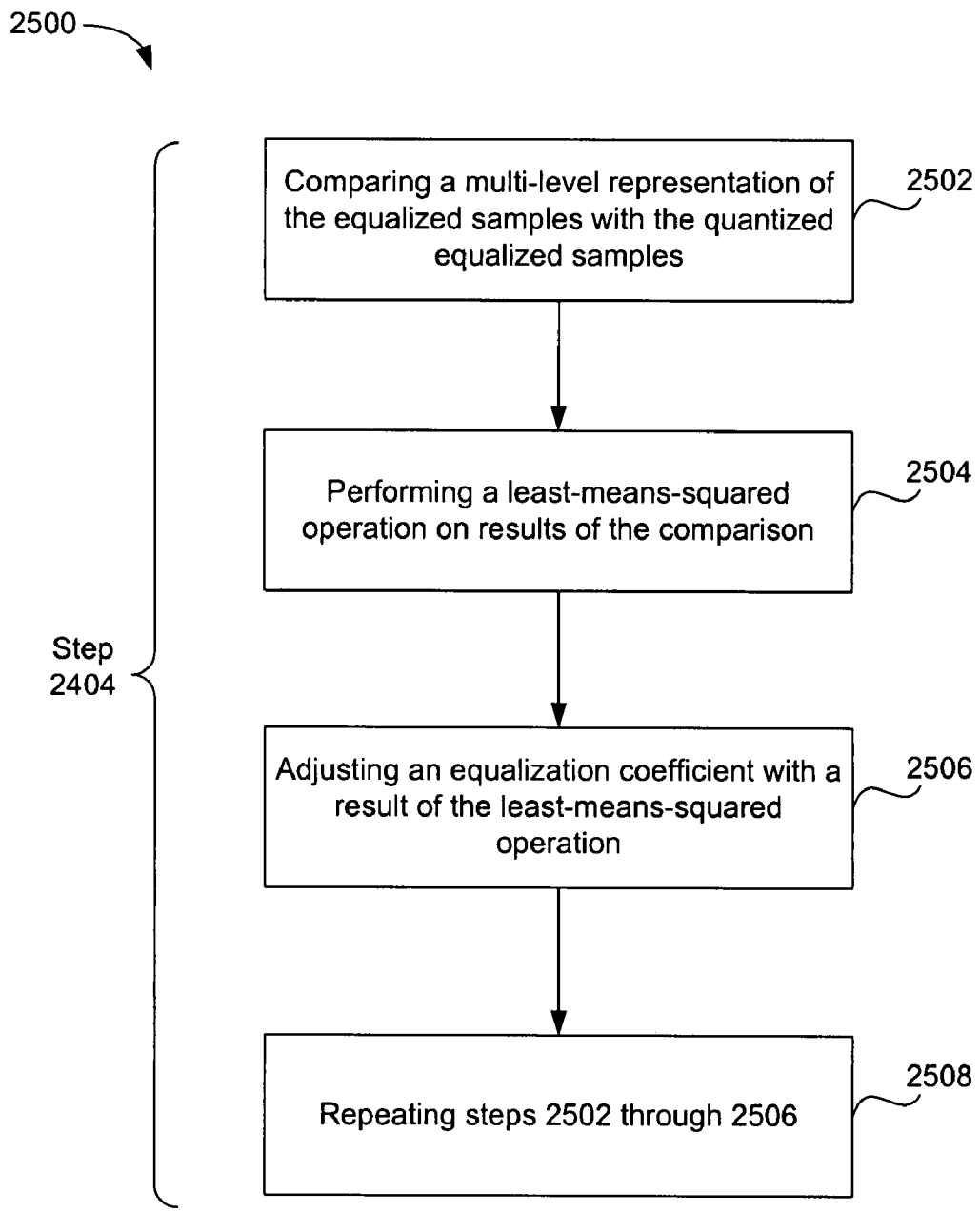
FIG. 25 is an example process flowchart for implementing the flowchart illustrated in FIG. 24.

FIG. 25 is an example process flowchart 2500 for implementing step 2404 in the flowchart 2400.

In an embodiment, steps 2502-2508 are performed at a sub-sample rate relative to the sampling of step 2402.

In an embodiment, steps 2502-2508 are performed at an off-set of a sub-sample rate relative to the sampling of step 2402.

Figure 26:
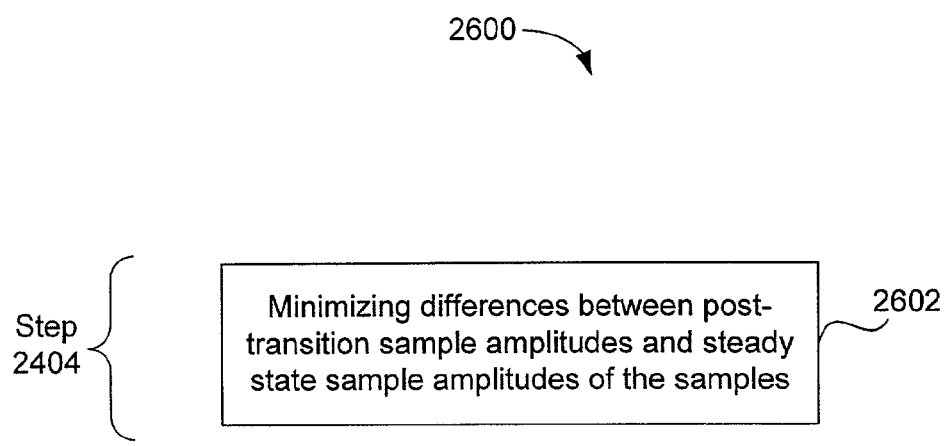
FIG. 26 is an example process flowchart for implementing the flowchart illustrated in FIG. 24.

FIG. 26 is an example process flowchart 2600 for implementing step 2404 in the flowchart 2400.

In an embodiment, step 2602 is performed at a sub-sample rate relative to the sampling of step 2402.

In an embodiment, step 2602 is performed at an off-set of a sub-sample rate relative to the sampling of step 2402.

Figure 27:
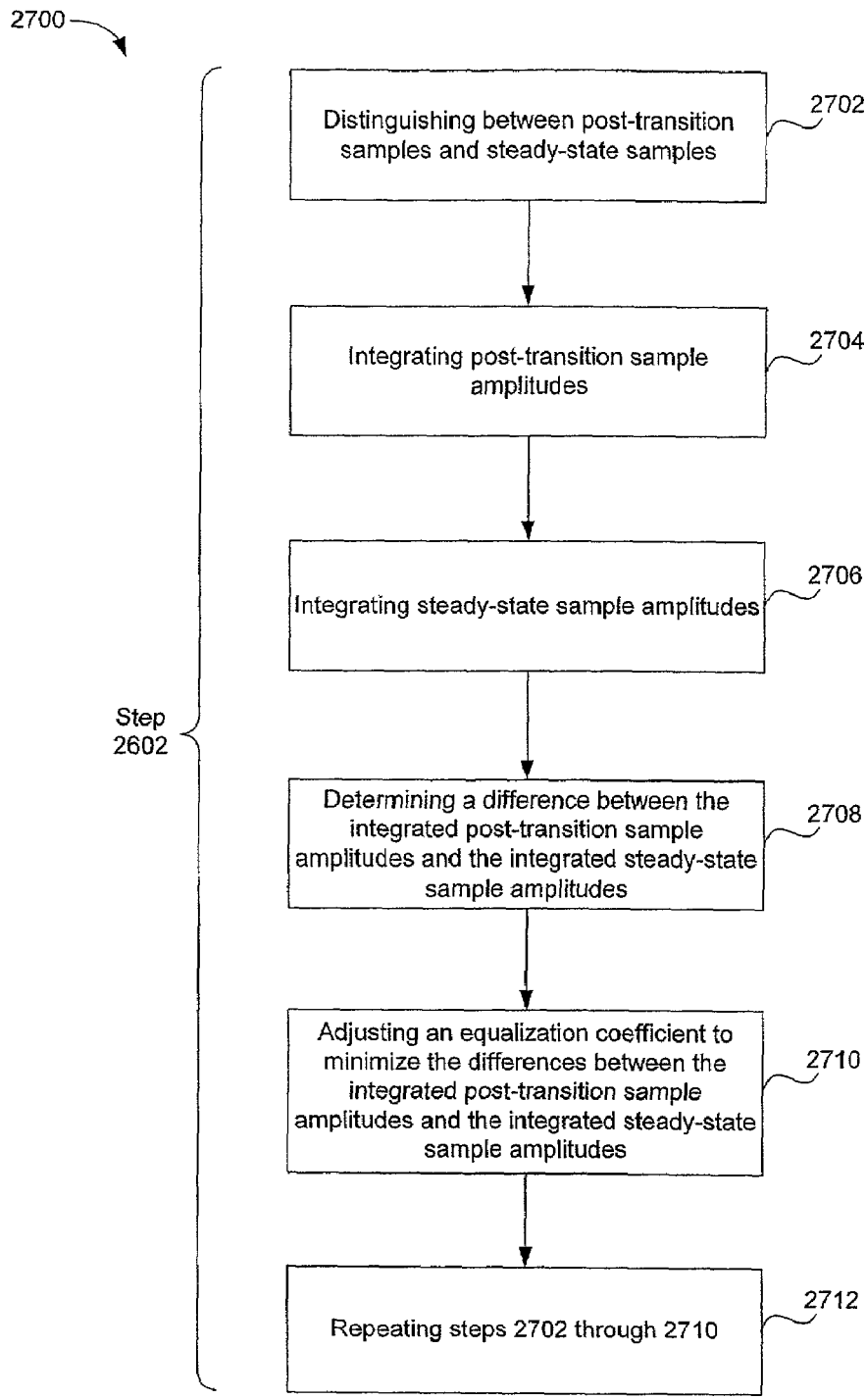
FIG. 27 is an example process flowchart for implementing the flowchart illustrated in FIG. 26.

FIG. 27 is an example process flowchart 2700 for implementing step 2602 in the flowchart 2600.

In an embodiment, steps 2704, 2706 and 2708 are performed by averaging.

In an embodiment, steps 2704, 2706 and 2708 are performed by accumulating.

Figure 28:
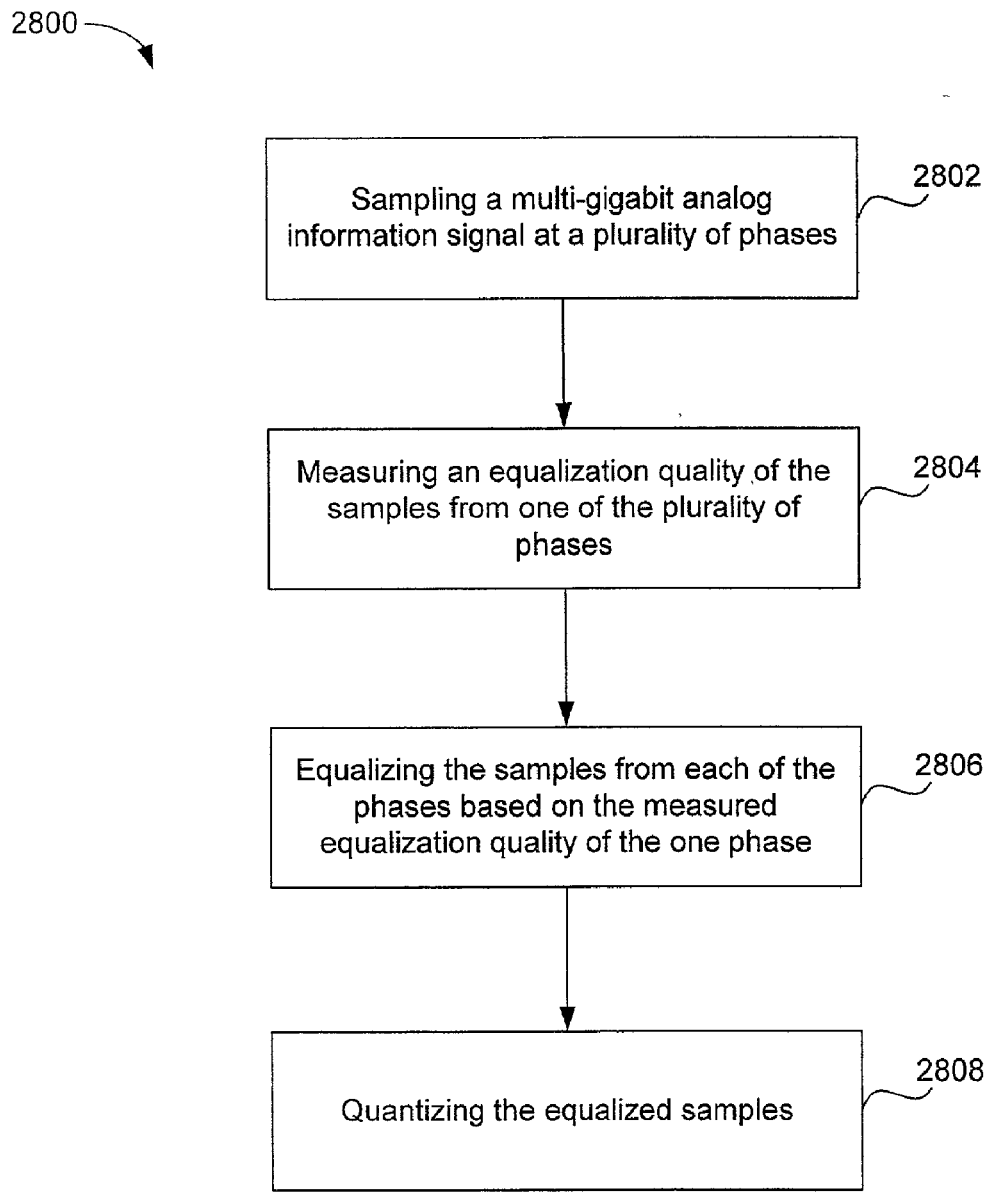
FIG. 28 is an example process flowchart for adaptively equalizing time-staggered portions of an analog information signal for a given signal path, in accordance with an aspect of the present invention.

FIG. 28 is an example process flowchart 2800 for adaptively equalizing time-staggered portions of an analog information signal for a given signal path.

In an embodiment, step 2804 is performed at a sub-sample rate relative to the sampling of step 2802.

In an embodiment, step 2804 is performed at an off-set of a sub-sample rate relative to the sampling of step 2802.

In an embodiment, the flowchart 2800 performed with one or more of the steps illustrated in one or more of the flowcharts 2500-2700.

FIG. 29 is an example process flowchart 2900 for adaptively equalizing time-staggered portions of a plurality of analog information signals for their respective signal paths.

In an embodiment, step 2908 is performed at a sub-sample rate relative to the sampling of step 2902.

In an embodiment, step 2908 is performed at an off-set of a sub-sample rate relative to the sampling of step 2902.

In an embodiment, the flowchart 2900 performed with one or more of the steps illustrated in one or more of the flowcharts 2500-2700.

FIG. 30 is an example process flowchart 3000 for adaptively equalizing a plurality of analog information signals for their respective signal paths.

In an embodiment, step 3006 is performed at a sub-sample rate relative to the sampling of step 3002.

In an embodiment, step 3006 is performed at an off-set of a sub-sample rate relative to the sampling of step 3002.

In an embodiment, the flowchart 3000 performed with one or more of the steps illustrated in one or more of the flowcharts 2500-2700.

X. Conclusions

The present invention has been described above with the aid of functional building blocks illustrating the performance of specified functions and relationships thereof. The boundaries of these functional building blocks have been arbitrarily defined herein for the convenience of the description. Alternate boundaries can be defined so long as the specified functions and relationships thereof are appropriately performed. Any such alternate boundaries are thus within the scope and spirit of the claimed invention. One skilled in the art will recognize that these functional building blocks can be implemented by discrete components, application specific integrated circuits, processors executing appropriate software and the like or any combination thereof.

While various embodiments of the present invention have been described above, it should be understood that they have been presented by way of example only, and not limitation. Thus, the breadth and scope of the present invention should not be limited by any of the above-described exemplary embodiments, but should be defined only in accordance with the following claims and their equivalents.

What is claimed is:

1. A method for adaptively equalizing a multi-gigabit analog information signal for a signal path, comprising the steps of:
   (1) sampling a multi-gigabit analog information signal, thereby generating analog samples;
   (2) performing an equalizing process on the analog samples, wherein the equalizing includes minimizing differences between an average of post-transition sample amplitudes and an average of steady state sample amplitudes of the analog samples; and
   (3) quantizing the equalized analog samples of the multi-gigabit analog information signal.

2. The method according to claim 1, wherein step (2) comprises the steps of:
   (a) comparing a multi-level representation of the equalized samples with the quantized equalized samples;
   (b) performing a least-means-squared operation on results of the comparison;
   (c) adjusting an equalization coefficient with a result of the least-means-squared operation; and
   (d) repeating steps (2)(a) through (2)(c).

3. The method according to claim 2, wherein steps (2)(a) through (2)(d) are performed at a sub-sample rate relative to the sampling of step (1).

4. The method according to claim 2, wherein steps (2)(a) through (2)(d) are performed at an off-set of a sub-sample rate relative to the sampling of step (1).

5. The method according to claim 1, wherein step (2) comprises the steps of:
   (a) distinguishing between post-transition samples and steady-state samples;
   (b) integrating post-transition sample amplitudes;
   (c) integrating steady-state sample amplitudes;
   (d) determining a difference between the integrated post-transition sample amplitudes and the integrated steady-state sample amplitudes;
   (e) adjusting an equalization coefficient to minimize the differences between an average of the integrated post-transition sample amplitudes and an average of the integrated steady-state sample amplitudes; and
   (f) repeating steps (2)(a) through (2)(e).

6. The method according to claim 5, wherein steps (2)(a) through (2)(f) are performed at a sub-sample rate relative to the sampling of step (1).

7. The method according to claim 5, wherein steps (2)(a) through (2)(f) are performed at an off-set of a sub-sample rate relative to the sampling of step (1).

8. The method according to claim 1, wherein step (2) comprises the steps of:
   (a) distinguishing between post-transition samples and steady-state samples;
   (b) averaging post-transition sample amplitudes;
   (c) averaging steady-state sample amplitudes;
   (d) determining a difference between the averaged post-transition sample amplitudes and the averaged steady-state sample amplitudes;
   (e) adjusting an equalization coefficient to minimize the differences between the integrated post-transition sample amplitudes and the integrated steady-state sample amplitudes; and
   (f) repeating steps (2)(a) through (2)(e).

9. The method according to claim 1, wherein step (2) comprises the steps of:
   (a) distinguishing between post-transition samples and steady-state samples;
   (b) accumulating post-transition sample amplitudes;
   (c) accumulating steady-state sample amplitudes;
   (d) determining a difference between the accumulated post-transition sample amplitudes and the accumulated steady-state sample amplitudes;
   (e) adjusting an equalization coefficient to minimize the differences between an average of the integrated post-transition sample amplitudes and an average of the integrated steady-state sample amplitudes; and
   (f) repeating steps (2)(a) through (2)(e).

10. The method according to claim 1, wherein step (2) comprises the step of minimizing inter-symbol interferences in the samples.

11. A method for adaptively equalizing time staggered portions of a multi-gigabit analog information signal for a signal path, comprising the steps of:
   (1) sampling the multi-gigabit analog information signal at a plurality of phases;
   (2) measuring an equalization quality of the samples from one of the plurality of phases;
   (3) equalizing the samples from each of the phases based on the measured equalization quality of the one phase, wherein the equalizing includes minimizing differences between an average of post-transition sample amplitudes and an average of steady state sample amplitudes of the analog samples; and
   (4) quantizing the equalized samples.

12. A method for adaptively equalizing time staggered portions of a plurality of multi-gigabit analog information signals for respective signal paths, comprising the steps of:
   (1) generating clock signals from the plurality multi-gigabit analog information signals;
   (2) sampling each of the multi-gigabit analog information signals at a plurality of phases of the respective clock signals;
   (3) measuring an equalization quality of the samples from one of the plurality of phases for each of the multi-gigabit analog information signals;
   (4) equalizing the samples from each of the phases of each of the multi-gigabit analog information signals based on the measured equalization quality of the one phase of each of the respective multi-gigabit analog information signals, wherein the equalizing includes minimizing differences between an average of post-transition sample amplitudes and an average of steady state sample amplitudes of the analog samples; and
   (5) quantizing the equalized samples.

13. A method for adaptively equalizing a plurality of multi-gigabit analog information signals for respective signal paths, comprising the steps of:
   (1) generating a clock signal for each of the multi-gigabit analog information signals from each of the respective multi-gigabit analog information signals;
   (2) sampling each of the multi-gigabit analog information signals according to the respective clock signals;
   (3) performing an equalizing process on the samples, wherein the equalizing includes minimizing differences between an average of post-transition sample amplitudes and an average of steady state sample amplitudes of the analog samples; and
   (4) quantizing the equalized samples.

14. A system for quantizing a multi-gigabit serial analog information signal, comprising:
   a sampler configured to sample a multi-gigabit analog signal to generate analog samples;
   an equalizer coupled to said sampler and configured to minimize inter-symbol interferences in samples output from said sampler, said equalizer including a finite impulse response ("FIR") having at least one adjustable tap;
   a quantizer coupled to said equalizer and configured to quantize equalized samples output from said equalizer; and
   control logic coupled to said FIR , said control logic including;
      a difference detector including a steady-state path, a post-transition path, and a combiner, wherein said combiner is configured to output an average difference between post-transition amplitudes of the equalized samples and steady-state amplitudes of the equalized samples; and
      a state machine coupled to one or more outputs of said difference detector and configured to generate said tap updates for said FIR according to said average difference.

15. The system according to claim 14, wherein said control logic further comprises:
   a first input coupled to an output of said equalizer;
   an analog-to-digital converter ("ADC") coupled to said first input; and
   a control module coupled to an output of said ADC;
   wherein said ADC is configured to generate multi-level representations of equalized samples, and wherein said control module is configured to generate tap updates from at least said multi-level representations of the equalized samples.

16. The system according to claim 14, wherein said control logic further comprises:
   a second input coupled to an output of said quantizer; and
   a least-means-squared ("LMS") module coupled to said first and second control logic inputs;
   wherein said LMS module is configured to compare the multi-level representations of equalized samples with the quantized samples from said quantizer, and to generate said tap updates according to the comparison.

17. A system for routing and adaptively equalizing high data rate analog data signals, comprising:
   a backplane having a plurality of signal paths; and
   at least one interface board coupled to said backplane, said interface board including a plurality of receivers coupled to said backplane signal paths, each said receiver including an adaptive equalizer;
   wherein each said adaptive equalizer is configured to adapt to an associated backplane signal path to equalize an analog data signal received from said associated backplane signal path; and
   wherein each said adaptive equalizer is configured to minimize differences between an average of post-transition sample amplitudes and an average of steady state sample amplitudes of the analog samples.

* * * * *